US012787317B2

(12) United States Patent
Enomoto et al.

(10) Patent No.: US 12,787,317 B2
(45) Date of Patent: Nov. 3, 2026

(54) CAPACITOR DEVICE

(71) Applicant: FUJI ELECTRIC CO., LTD., Kawasaki (JP)

(72) Inventors: Kazuo Enomoto, Matsumoto-city (JP); Yushi Sato, Matsumoto-city (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 390 days.

(21) Appl. No.: 18/518,855

(22) Filed: Nov. 24, 2023

(65) Prior Publication Data

US 2024/0258367 A1 Aug. 1, 2024

(30) Foreign Application Priority Data

Jan. 31, 2023 (JP) ................................ 2023-012765

(51) Int. Cl.
*H10D 1/68* (2025.01)
*H10D 1/47* (2025.01)
*H10W 20/40* (2026.01)

(52) U.S. Cl.
CPC ............... *H10D 1/716* (2025.01); *H10D 1/47* (2025.01); *H10W 20/498* (2026.01)

(58) Field of Classification Search
CPC ....... H10D 1/716; H10D 1/47; H10W 20/498; H10W 44/601; H10W 74/111; H10W 90/00; H01G 4/236; H01G 4/228; H01G 4/40; H02M 7/003; G01R 15/06; G01R 19/0092; G01R 31/2601
See application file for complete search history.

(56) References Cited

U.S. PATENT DOCUMENTS

2008/0175082 A1* 7/2008 Noh .................... G11C 11/4074 327/551
2012/0106220 A1* 5/2012 Yamaguchi ............ H05K 7/209 363/131
2024/0243030 A1* 7/2024 Omae .................. H05K 1/0209

FOREIGN PATENT DOCUMENTS

JP 2000-102241 A 4/2000
JP 2020-017678 A 1/2020

* cited by examiner

*Primary Examiner* — Mark W Tornow
(74) *Attorney, Agent, or Firm* — Rabin & Berdo, P.C.

(57) ABSTRACT

A capacitor device connected to a semiconductor device includes a capacitor element including a first electrode and a second electrode, a first wiring and a second wiring. The first wiring has a first one end portion connected to the first electrode and a first other end portion connected to a first electrode terminal of the semiconductor device, and the second wiring has a second one end portion connected to the second electrode and a second other end portion connected to a second electrode terminal of the semiconductor device. A resistor is provided between the first one end portion and the first other end portion of the first wiring and is electrically connected directly to the first wiring.

11 Claims, 14 Drawing Sheets

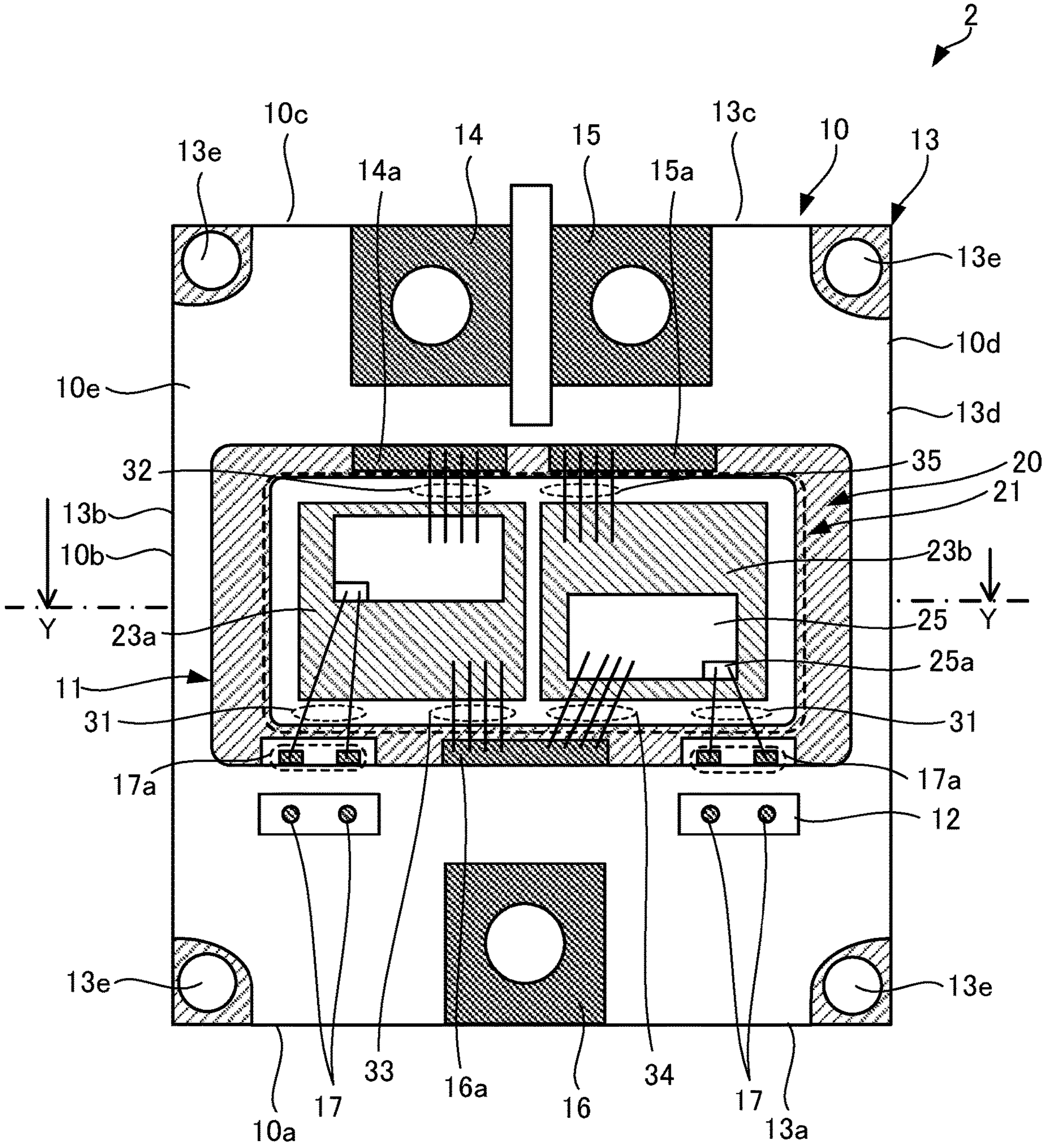
FIG. 4
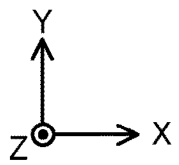

CAPACITOR DEVICE

CROSS-REFERENCE TO RELATED APPLICATION

This application is based upon and claims the benefit of priority of the prior Japanese Patent Application No. 2023-012765, filed on Jan. 31, 2023, the entire contents of which are incorporated herein by reference.

BACKGROUND OF THE INVENTION

1. Field of the Invention

The embodiments discussed herein relate to a capacitor device.

2. Background of the Related Art

There is a power conversion device in which a terminal drawn from a module having a capacitor mounted therein is connected to an insulated gate bipolar transistor (IGBT) module (see, for example, Japanese Laid-open Patent Publication No. 2000-102241). A shunt resistor is used for detecting a large short-circuit current (see, for example, Japanese Laid-open Patent Publication No. 2020-017678).

SUMMARY OF THE INVENTION

According to one aspect, there is provided a capacitor device connected to a semiconductor device, the capacitor device including: a capacitor element including a first electrode and a second electrode; a first wiring having a first one end portion connected to the first electrode and a first other end portion connected to a first electrode terminal of the semiconductor device; and a second wiring having a second one end portion connected to the second electrode and a second other end portion connected to a second electrode terminal of the semiconductor device, wherein a resistor is provided between the first one end portion and the first other end portion of the first wiring and is electrically connected directly to the first wiring.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF THE DRAWINGS

FIG. 4 is a plan view of the semiconductor device (without sealing) according to the first embodiment;

DETAILED DESCRIPTION OF THE INVENTION

Figure 1:
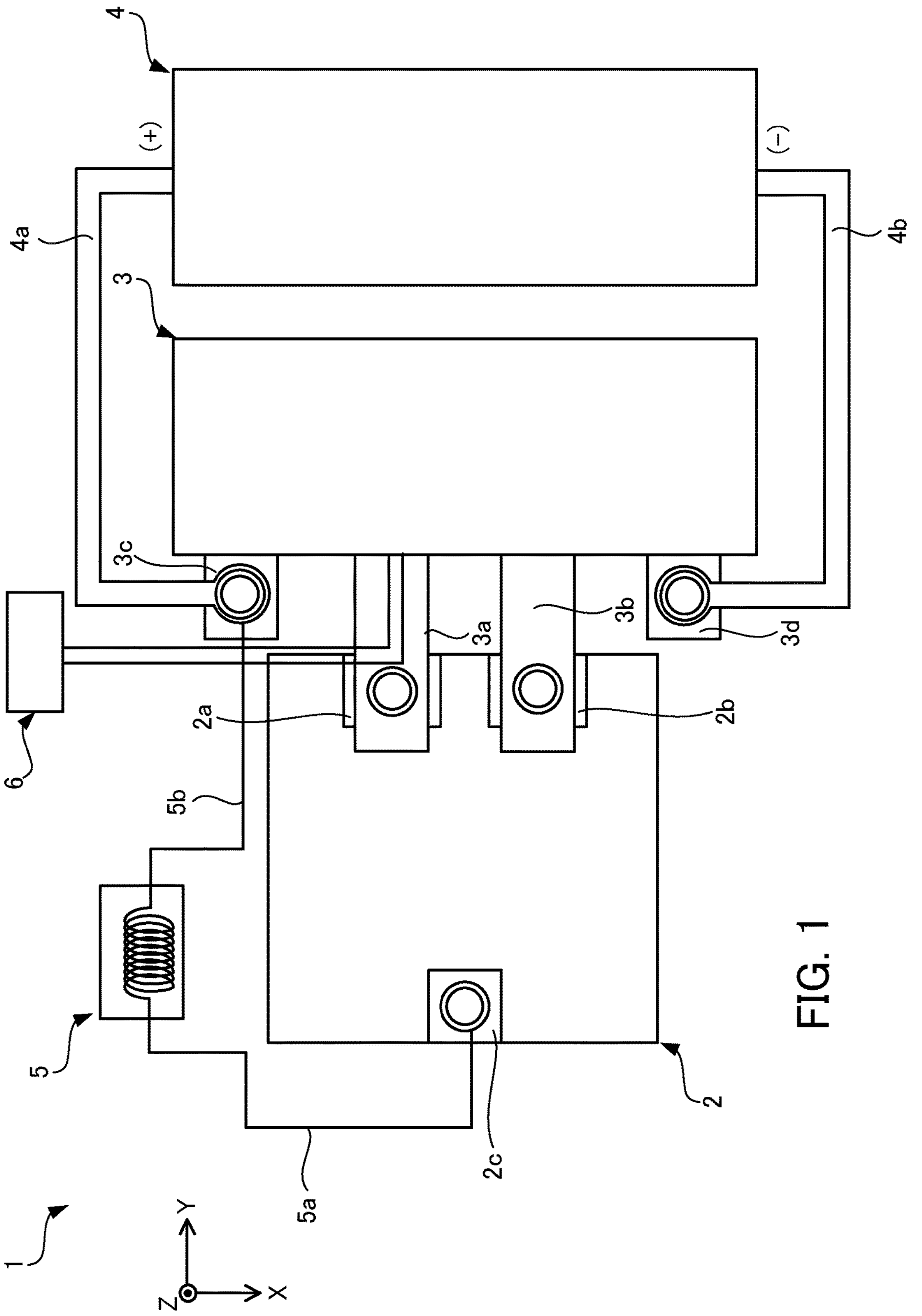
FIG. 1 illustrates a current detection system according to a first embodiment.

Hereinafter, embodiments will be described with reference to the accompanying drawings. In the following description, the terms “front surface” and “top surface” refer to an X-Y plane facing up (in the +Z direction) in a semiconductor device 2 and capacitor device 3 illustrated in drawings. Similarly, the term “up” refers to an upward direction (the +Z direction) in the semiconductor device 2 and capacitor device 3 illustrated in the drawings. The terms “rear surface” and “bottom surface” refer to an X-Y plane facing down (in the −Z direction) in the semiconductor device 2 and capacitor device 3 illustrated in the drawings. Similarly, the term “down” refers to a downward direction (the −Z direction) in the semiconductor device 2 and capacitor device 3 illustrated in the drawings. The same directionality applies to other drawings, as appropriate. The terms “front surface,” “top surface,” “up,” “rear surface,” “bottom surface,” “down,” and “side surface” are used for convenience to describe relative positional relationships, and do not limit the technical ideas of the embodiments. For example, the terms “up” and “down” are not always related to the vertical directions to the ground. That is, the “up” and “down” directions are not limited to the gravity direction. In addition, in the following description, the term “main component” refers to a component contained at a volume ratio of 80 vol % or more. The expression “being approximately equal” may allow an error range of ±10%. In addition, the expressions “being perpendicular” and “being parallel” may allow an error range of ±10%.

FIRST EMBODIMENT

A current detection system 1 that detects a main current of a semiconductor device 2 will be described with reference to FIG. 1. FIG. 1 illustrates a current detection system according to a first embodiment. The current detection system 1 includes a semiconductor device 2, which is a detection target, a capacitor device 3, a power supply device 4, an inductance device 5, and a current detection device 6.

The semiconductor device 2 includes semiconductor chips that have a switching function, and serves as an inverter. The semiconductor device 2 includes a first electrode terminal 2*a*, a second electrode terminal 2*b*, and an output terminal 2*c* that outputs a main current. In this connection, the positive electrode and negative electrode of the power supply device 4 are connected respectively to the first electrode terminal 2*a* and second electrode terminal 2*b*, for example. The semiconductor device 2 will be described in detail later.

The capacitor device 3 includes a capacitor element with a first electrode and a second electrode, and also includes a first wiring 3*a* and a second wiring 3*b* connected respectively to the first electrode and second electrode, a first power supply terminal 3*c*, and a second power supply terminal 3*d*. Each connection here is done by fastening using a bolt, for example. In this connection, the first power supply terminal 3*c* and second power supply terminal 3*d* are connected respectively to the positive electrode and negative electrode, for example.

In this connection, the first wiring 3*a* and second wiring 3*b* are connected respectively to the first power supply terminal 3*c* and second power supply terminal 3*d* inside the capacitor device 3. Furthermore, the capacitor device 3 includes a resistor part in the first wiring 3*a*, and the resistor part is sealed inside the capacitor device 3. The capacitor device 3 will be described in detail later.

The power supply device 4 includes a first power supply wiring 4*a* and a second power supply wiring 4*b* and supplies power to the semiconductor device 2 and capacitor device 3. The first power supply wiring 4*a* and second power supply wiring 4*b* are connected to the first power supply terminal 3*c* and second power supply terminal 3*d* of the capacitor device 3, respectively. Each connection here is done by fastening using a bolt, for example. The first electrode terminal 2*a* and second electrode terminal 2*b* of the semiconductor device 2 are connected to the first power supply wiring 4*a* and second power supply wiring 4*b* via the first wiring 3*a* and second wiring 3*b* of the capacitor device 3, respectively.

In this connection, the first power supply wiring 4*a* and second power supply wiring 4*b* of the power supply device 4 may directly be connected to the first electrode terminal 2*a* and second electrode terminal 2*b* of the semiconductor device 2. Each connection here is done by fastening using a bolt, for example. In this case, there is no need to provide the first power supply terminal 3*c* and second power supply terminal 3*d* in the capacitor device 3.

The inductance device 5 is a load of the semiconductor device 2 and is a coil or a motor, for example. The case of using a coil is exemplified here. One terminal of the inductance device 5 is connected to the output terminal 2*c* of the semiconductor device 2 via a wiring 5*a*. The other terminal of the inductance device 5 is connected to the first electrode terminal 2*a* of the semiconductor device 2 via a wiring 5*b*, the first power supply terminal 3*c*, and the first wiring 3*a*.

The current detection device 6 detects a current flowing through the resistor part of the capacitor device 3. For example, the current detection device 6 is an oscilloscope. A pair of probes in the current detection device 6 detect the current flowing through the resistor part inside the capacitor device 3.

In the above current detection system 1, a control signal to be applied to control terminals, which will be described later, of the semiconductor device 2 is switched on and off while power is supplied from the power supply device 4. At this time, a current flowing between the first electrode terminal 2*a* of the semiconductor device 2 and the first wiring 3*a* of the capacitor device 3 is detected by the current detection device 6. On the basis of the result of detecting the current, dynamic electrical characteristics of the semiconductor device 2 may be evaluated. For example, the rise time and fall time of the current according to the switching on and off of the control signal and a power loss caused due to heating of the semiconductor chips in the on-off switching time of the control signal may be measured, and the dynamic electrical characteristics may be evaluated based on the voltage and current of each unit.

Figure 2:
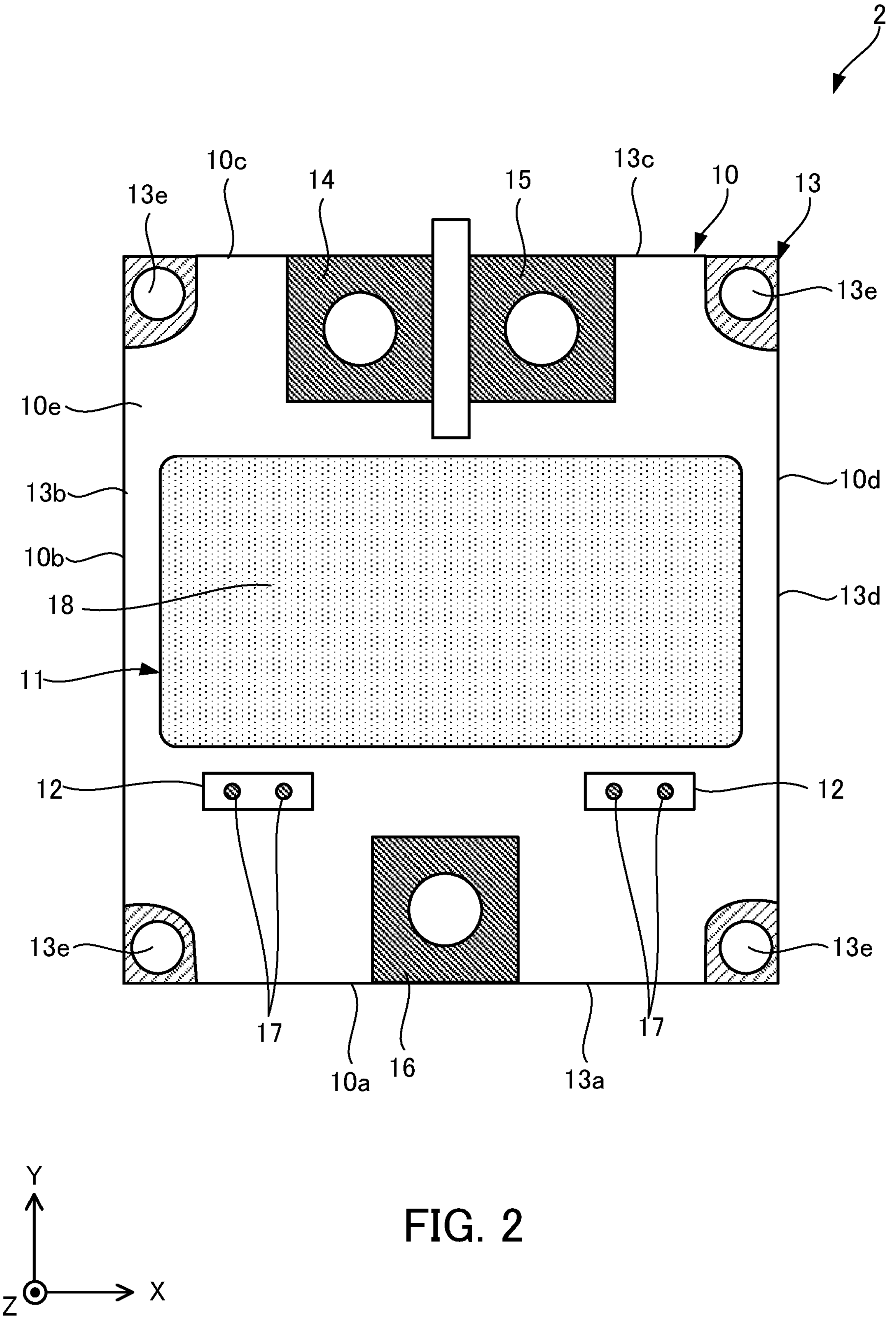
FIG. 2 is a plan view of a semiconductor device (with sealing) according to the first embodiment.
Figure 3:
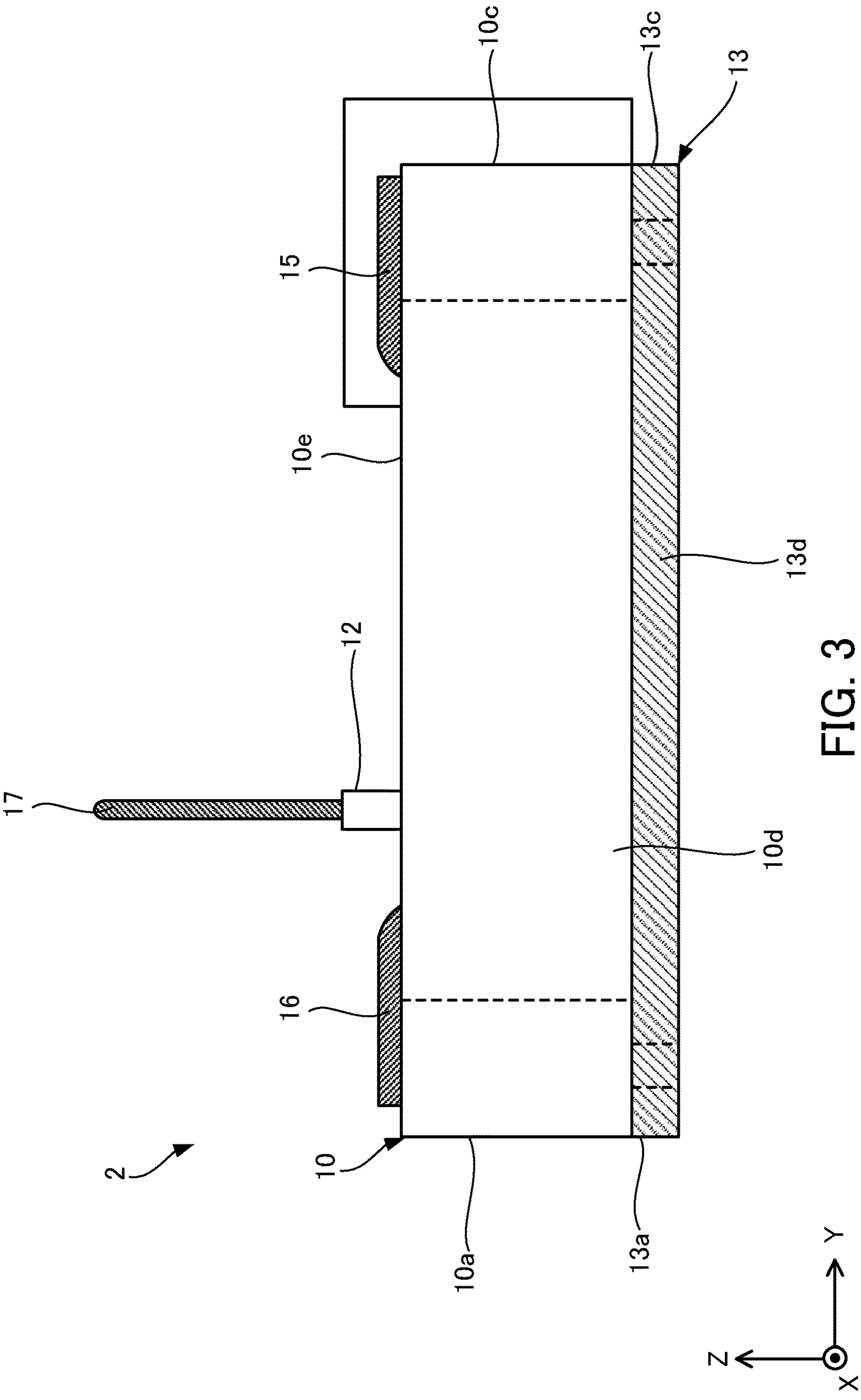
FIG. 3 is a side view of the semiconductor device according to the first embodiment.
Figure 5:
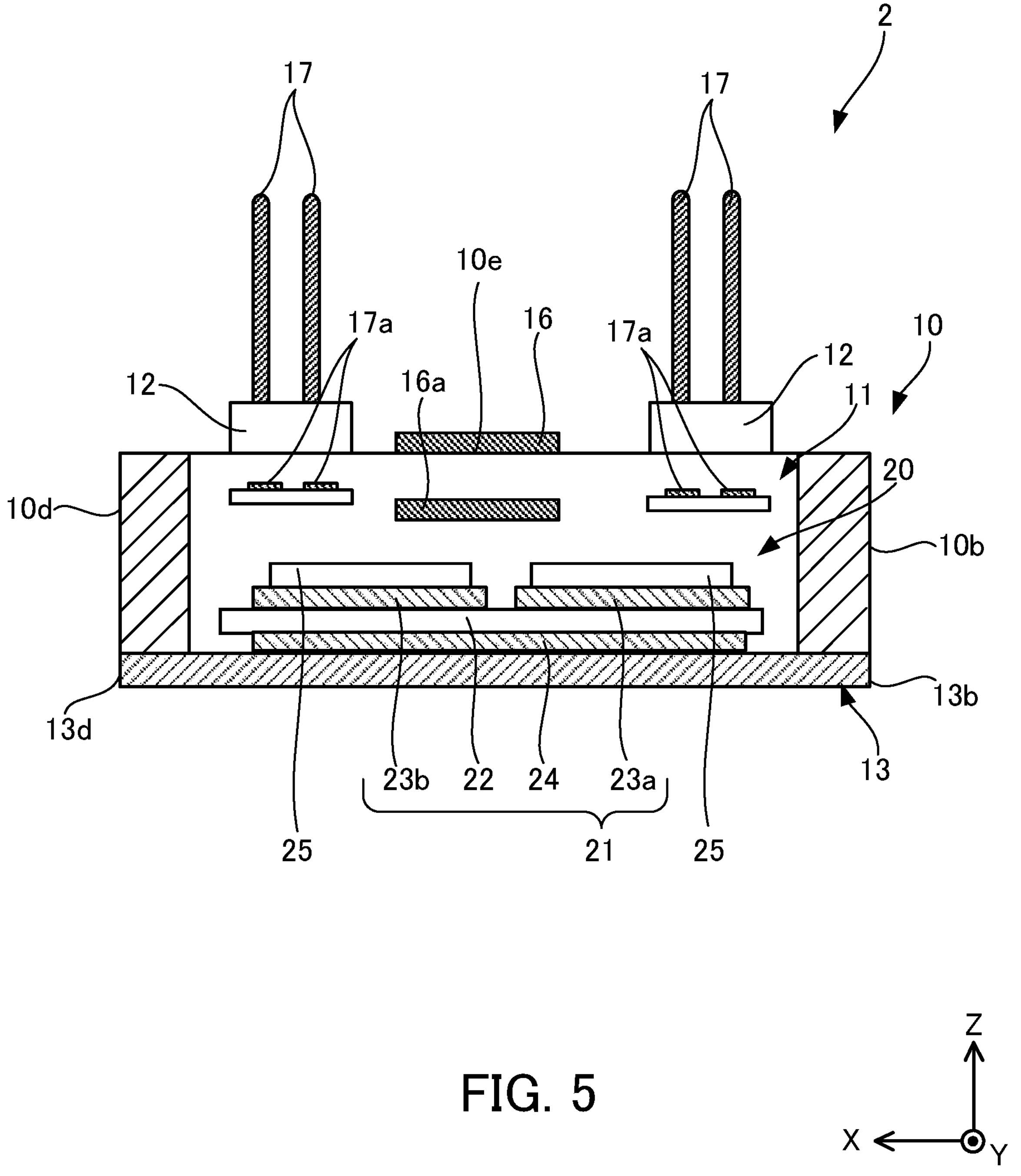
FIG. 5 is a sectional view of the semiconductor device according to the first embodiment.

The following describes the semiconductor device 2 included in the current detection system 1 with reference to FIGS. 2 to 5. FIG. 2 is a plan view of the semiconductor device (with sealing) according to the first embodiment. FIG. 3 is a side view of the semiconductor device according to the first embodiment. FIG. 4 is a plan view of the semiconductor device (without sealing) according to the first embodiment. FIG. 5 is a sectional view of the semiconductor device according to the first embodiment.

In this connection, FIG. 3 is a side view of the semiconductor device 2 of FIG. 2 seen in the −X direction. FIG. 4 illustrates the case (without sealing) where a sealing member 18 is removed in FIG. 2. FIG. 5 is a sectional view taken along a dash-dotted line Y-Y of FIG. 4. In addition, the illustration of various wires is omitted in FIG. 5.

The semiconductor device 2 includes two semiconductor chips that have a switching function, as will be described later, and achieves a power conversion function. The semiconductor device 2, which will be described in detail below, is an example of a detection target in the current detection system 1. That is, the detection target is not limited to the semiconductor device 2, but may be another semiconductor device that achieves a power conversion function.

The semiconductor device 2 includes a heat dissipation plate 13 and a case 10 provided on the heat dissipation plate 13 (FIGS. 2 and 3). The semiconductor device 2 also includes a semiconductor unit 20 housed in the case 10 (FIGS. 4 and 5). In addition, the semiconductor unit 20 is sealed with the sealing member 18 inside the case 10 (FIG. 2).

The case 10 has a cuboid shape, and includes a top surface 10*e*, which is rectangular in plan view, and a short side surface 10*a*, long side surface 10*b*, short side surface 10*c*, and long side surface 10*d* that surround the four sides of the top surface 10*e* in order. In this connection, the short side surfaces 10*a* and 10*c* correspond to the short side of the case 10 in plan view, whereas the long side surfaces 10*b* and 10*d* correspond to the long side of the case 10 in plan view.

Terminal bases 12 are provided on the top surface 10*e* of the case 10, and the opening of a storage space 11 is formed in the top surface 10*e*. Control terminals 17 extend vertically upward from the terminal bases 12 in perpendicular to the top surface 10*e*. In addition, on the top surface 10*e*, a first electrode terminal 14 and a second electrode terminal 15 are provided on the side where the short side surface 10*c* is located, and an output terminal 16 is provided on the side where the short side surface 10*a* is located. One end portion of each of the first electrode terminal 14, second electrode terminal 15, and output terminal 16 is exposed on the top surface 10*e*.

The case 10 is integrally formed with the first electrode terminal 14, second electrode terminal 15, output terminal 16, and control terminals 17 by injection molding using a thermoplastic resin. By doing so, the case 10 is obtained. Examples of the thermoplastic resin include a polyphenylene sulfide resin, a polybutylene terephthalate resin, a polybutylene succinate resin, a polyamide resin, and an acrylonitrile butadiene styrene resin. The case 10 may correspond in size to the heat dissipation plate 13 in plan view. This case 10 is attached to the heat dissipation plate 13 using an adhesive.

The heat dissipation plate 13 is made of a metal with high thermal conductivity as a main component. Examples of the metal include copper, aluminum, and an alloy containing one of these. Plating may be performed on the heat dissipation plate 13 to improve its corrosion resistance. Examples of the plating material used here include nickel, a nickel-phosphorus alloy, and a nickel-boron alloy. For example, the thickness of the heat dissipation plate 13 is in the range of 0.5 mm to 5 mm, inclusive. The heat dissipation plate 13 has a flat plate shape, and is surrounded on the four sides by a short side surface 13*a*, a long side surface 13*b*, a short side surface 13*c*, and long side surface 13*d* in order. The short side surfaces 13*a* and 13*c* correspond to the short side of the heat dissipation plate 13 in plan view, and the long side surfaces 13*b* and 13*d* correspond to the long side of the heat dissipation plate 13 in plan view. In addition, the short side surface 13*a*, long side surface 13*b*, short side surface 13*c*, and long side surface 13*d* of the heat dissipation plate 13 correspond to and are aligned with the short side surface 10*a*, long side surface 10*b*, short side surface 10*c*, and long side surface 10*d* of the case 10, respectively. Fastening holes 13*e* are respectively formed at the four corners of the heat dissipation plate 13. The fastening holes 13*e* at the four corners penetrate the heat dissipation plate 13 and are circular in plan view.

The control terminals 17 are each electrically connected to the control electrode of a semiconductor chip, which will be described later, inside the case 10. The first electrode terminal 14 and second electrode terminal 15 correspond to the first electrode terminal 2*a* and second electrode terminal 2*b* of the semiconductor device 2 of FIG. 1, respectively. Inside the case 10, the first electrode terminal 14 is electrically connected to the input electrode of a semiconductor chip that will be described later, and the second electrode terminal 15 is electrically connected to the output electrode of a semiconductor chip that will be described later. The output terminal 16 corresponds to the output terminal 2*c* of the semiconductor device 2 of FIG. 1. The output terminal 16 is electrically connected to an input electrode and output electrode of the semiconductor chips that will be described later, inside the case 10.

The first electrode terminal 14, second electrode terminal 15, output terminal 16, and control terminals 17 are made of a metal with high electrical conductivity. Examples of the metal here include copper, aluminum, and an alloy containing one of these. Plating may be performed on the surfaces of the first electrode terminal 14, second electrode terminal 15, output terminal 16, and control terminals 17. Examples of the plating material used here include nickel, a nickel-phosphorus alloy, a nickel-boron alloy, and tin.

In addition, the other end portion (first inner end portion 14*a*) of the first electrode terminal 14, the other end portion (second inner end portion 15*a*) of the second electrode terminal 15, the other end portion (inner end portion 16*a*) of the output terminal 16, and the other end portions (inner end portions 17*a*) of the control terminals 17 are exposed to the inside of the storage space 11 of the case 10 (FIG. 4).

The storage space 11 of the case 10 is filled with the sealing member 18. The sealing member 18 may be a thermosetting resin. Examples of the thermosetting resin include an epoxy resin, a phenolic resin, a maleimide resin, and a polyester resin, and is preferably an epoxy resin. In addition, the sealing member 18 may contain a filler as an additive. The filler may contain insulating ceramics with high thermal conductivity. The sealing member 18 is not limited to the thermosetting resin, but may be made of a silicon-based gel.

The semiconductor unit 20 includes an insulated circuit substrate 21 and two semiconductor chips 25, as illustrated in FIGS. 4 and 5. The semiconductor chips 25 are bonded to the insulated circuit substrate 21 using a bonding material (not illustrated). The bonding material is a solder or a sintered material. The solder may be a lead-free solder. For example, the lead-free solder contains, as a main component, an alloy containing at least two of tin, silver, copper, zinc, antimony, indium, and bismuth. In addition, the solder may contain an additive. For example, the additive may contain nickel, germanium, cobalt, or silicon as a main component. The solder containing such an additive exhibits improved wettability, gloss, and bonding strength, which results in improving the reliability. As the sintered material, a metal material containing silver, copper, or an alloy containing at least one of these is used, for example.

The insulated circuit substrate 21 includes an insulating plate 22, circuit patterns 23*a* and 23*b*, and a metal plate 24. The insulating plate 22 and metal plate 24 are rectangular in plan view. In addition, the corners of the insulating plate 22 and metal plate 24 may be rounded or chamfered. In plan view, the metal plate 24 is smaller in size than the insulating plate 22 and is formed inside the insulating plate 22.

The insulating plate 22 is made of an insulating material with high thermal conductivity. The insulating plate 22 is made of ceramics. Examples of ceramics include aluminum oxide, aluminum nitride, and silicon nitride.

The circuit patterns 23*a* and 23*b* are formed on the front surface of the insulating plate 22. The circuit patterns 23*a* and 23*b* are made of a metal with high electrical conductivity. Examples of the metal include copper, aluminum, and an alloy containing at least one of these as a main component. Plating may be performed on the surfaces of the circuit patterns 23*a* and 23*b* to improve their corrosion resistance. Examples of the plating material used here include nickel, a nickel-phosphorus alloy, and a nickel-boron alloy.

The circuit patterns 23*a* and 23*b* are rectangular in plan view. The circuit patterns 23*a* and 23*b* are formed respectively on opposite sides of a center line parallel to the ±Y directions of the insulating plate 22 on the front surface of the insulating plate 22 such that they are in line symmetry with respect to the center line. The circuit patterns 23*a* and 23*b* are greater in size than the semiconductor chips 25.

These circuit patterns 23*a* and 23*b* are formed on the front surface of the insulating plate 22 in the following manner. The circuit patterns 23*a* and 23*b* are formed in predetermined shape by forming a metal layer on the front surface of the insulating plate 22 and performing etching or another on the metal layer. Alternatively, the circuit patterns 23*a* and 23*b* cut out of a metal layer in advance may be press-bonded to the front surface of the insulating plate 22. In this connection, the circuit patterns 23*a* and 23*b* are illustrated just as an example, and the quantity, shapes, sizes, and positions of the circuit patterns 23*a* and 23*b* may be determined as appropriate.

The metal plate 24 is formed on the rear surface of the insulating plate 22. The metal plate 24 is rectangular. In plan view, the area of the metal plate 24 is smaller than that of the insulating plate 22, and is greater than the area of regions where the circuit patterns 23*a* and 23*b* are formed. The corners of the metal plate 24 may be rounded or chamfered. The metal plate 24 is smaller in size than the insulating plate 22, and is formed on the entire surface of the insulating plate 22 except for the outer periphery thereof. The metal plate 24 is made of a metal with high thermal conductivity as a main component. Examples of the metal include copper, aluminum, and an alloy containing at least one of these.

As the insulated circuit substrate 21 configured as above, a direct copper bonding (DCB) substrate or an active metal brazed (AMB) substrate may be used, for example. The front surface of a cooling device may be attached to the rear surface of the heat dissipation plate 13 on which the insulated circuit substrate 21 is disposed, using the above-described bonding material (not illustrated). Heat generated by the semiconductor chips 25 may be transferred via the circuit patterns 23*a* and 23*b*, insulating plate 22, metal plate 24, and heat dissipation plate 13 to the cooling device and then dissipated.

In this connection, the bonding material (not illustrated) that is used to bond the heat dissipation plate 13 to the cooling device may be a brazing material or a thermal interface material. For example, the brazing material contains, as a main component, at least one of an aluminum alloy, a titanium alloy, a magnesium alloy, a zirconium alloy, and a silicon alloy. For example, the thermal interface material is an adhesive containing an elastomer sheet, a room temperature vulcanization (RTV) rubber, a gel, a phase change material, or another. The use of such a brazing material or thermal interface material for the attachment of the cooling device improves the heat dissipation of the semiconductor device 2.

The semiconductor chips 25 may be power devices made of silicon carbide. One example of the power devices is a power metal-oxide-semiconductor field-effect transistor (MOSFET). The semiconductor chips 25 of this type each have a drain electrode serving as an input electrode (main electrode) on the rear surface thereof and a gate electrode serving as a control electrode 25*a* and a source electrode serving as an output electrode (main electrode) on the front surface thereof.

Alternatively, the semiconductor chips 25 may be power devices made of silicon. The power devices in this case are reverse-conducting (RC)-IGBTs, for example. An RC-IGBT has an IGBT and a free-wheeling diode (FWD) fabricated on a single chip. The IGBT is a switching element, and the FWD is a diode element. The semiconductor chips 25 of this type each have a collector electrode serving as an input electrode (main electrode) on the rear surface thereof and have a gate electrode serving as a control electrode and an emitter electrode serving as an output electrode (main electrode) on the front surface thereof.

In this connection, the semiconductor chips 25 may be disposed on the circuit patterns 23*a* and 23*b*, respectively, as illustrated in FIGS. 4 and 5. In the first embodiment, the case where one semiconductor chip 25 is disposed on each of the circuit patterns 23*a* and 23*b* is illustrated. In this case, the semiconductor chips 25 are disposed such that their control electrodes 25*a* face in the −Y direction (toward the output terminal 16).

In addition, instead of power MOSFETs and RC-IGBTs, a combination of switching element and diode element may be used as each semiconductor chip 25. For example, a switching element is an IGBT or a power MOSFET, and a diode element is an FWD such as a Schottky barrier diode (SBD) or a P-intrinsic-N (PiN) diode. The semiconductor chips 25 that are diode elements each have an output electrode (cathode electrode) serving as a main electrode on the rear surface thereof and an input electrode (anode electrode) serving as a main electrode on the front surface thereof.

This semiconductor unit 20 is electrically connected to the first electrode terminal 14, second electrode terminal 15, output terminal 16, and control terminals 17 with various wires. More specifically, control wires 31 directly connect the control electrodes 25*a* of the semiconductor chips 25 to the inner end portions 17*a* of the control terminals 17.

Main current wires 32 directly connect the first inner end portion 14*a* of the first electrode terminal 14 to the output terminal of the semiconductor chip 25 (illustrated in the left part of FIG. 4). Main current wires 33 directly connect the inner end portion 16*a* of the output terminal 16 to the circuit pattern 23*a*. More specifically, the main current wires 33 are electrically connected to the input terminal of the semiconductor chip 25 (illustrated in the left part of FIG. 4).

Main current wires 34 directly connect the inner end portion 16*a* of the output terminal 16 to the output terminal of the semiconductor chip 25 (illustrated in the right part of FIG. 4). Main current wires 35 directly connect the second inner end portion 15*a* of the second electrode terminal 15 to the circuit pattern 23*b*. More specifically, the main current wires 35 are electrically connected to the input terminal of the semiconductor chip 25 (illustrated in the right part of FIG. 4).

In this connection, the control wires 31 and main current wires 32 to 35 are made of a material with high electrical conductivity as a main component. Examples of the material include gold, copper, aluminum, and an alloy containing at least one of these. The wires are preferably made of an aluminum alloy containing a very small amount of silicon. In addition, the main current wires 32 to 35 are not wires but may be lead frames, for example.

These semiconductor unit 20, control wires 31, and main current wires 32 to 35 are housed in the storage space 11 of the case 10, and then are sealed with the sealing member 18 inside the storage space 11. The semiconductor device 2 has the above-described configuration.

Figure 6:
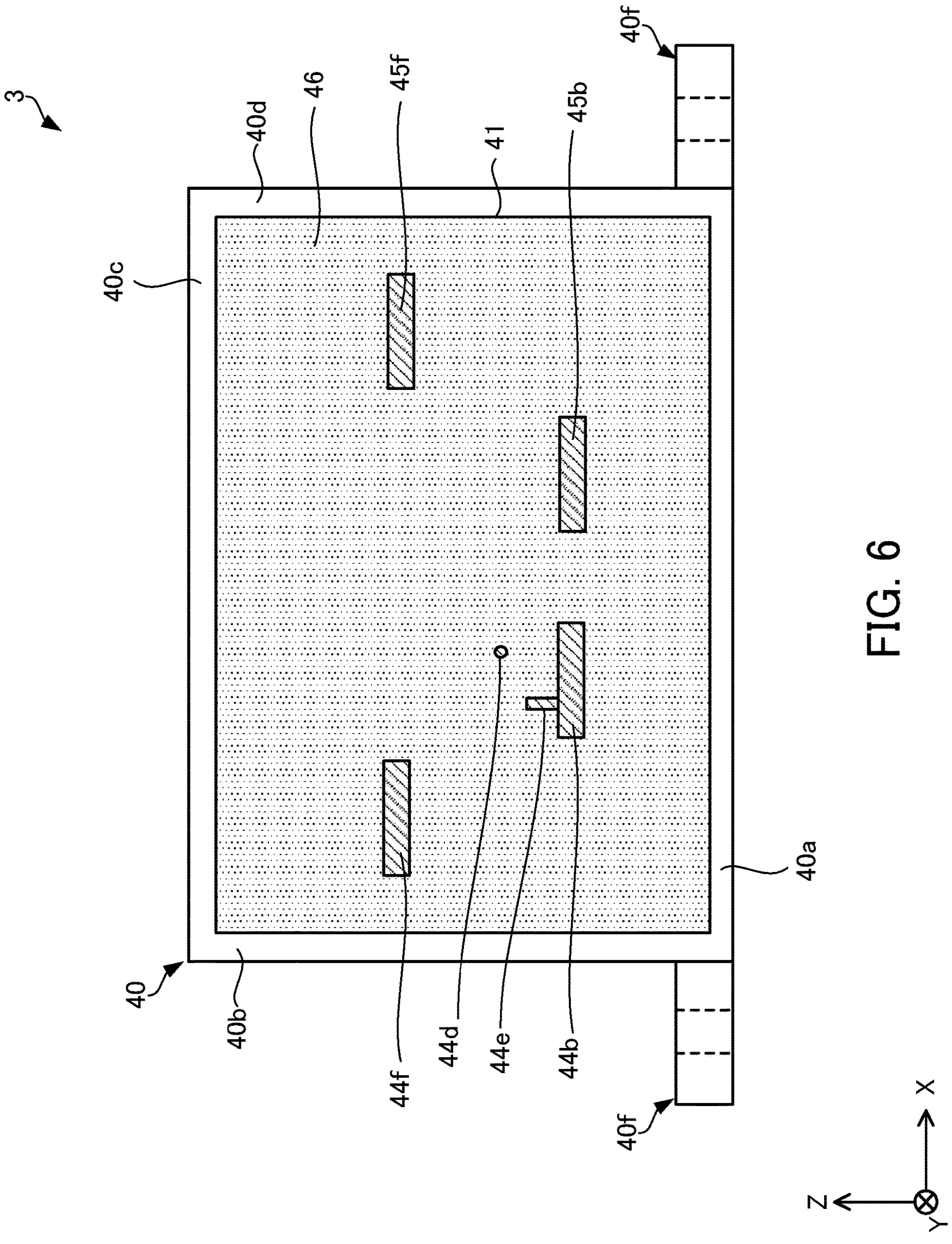
FIG. 6 is a side view of a capacitor device (with sealing) according to the first embodiment.
Figure 7:
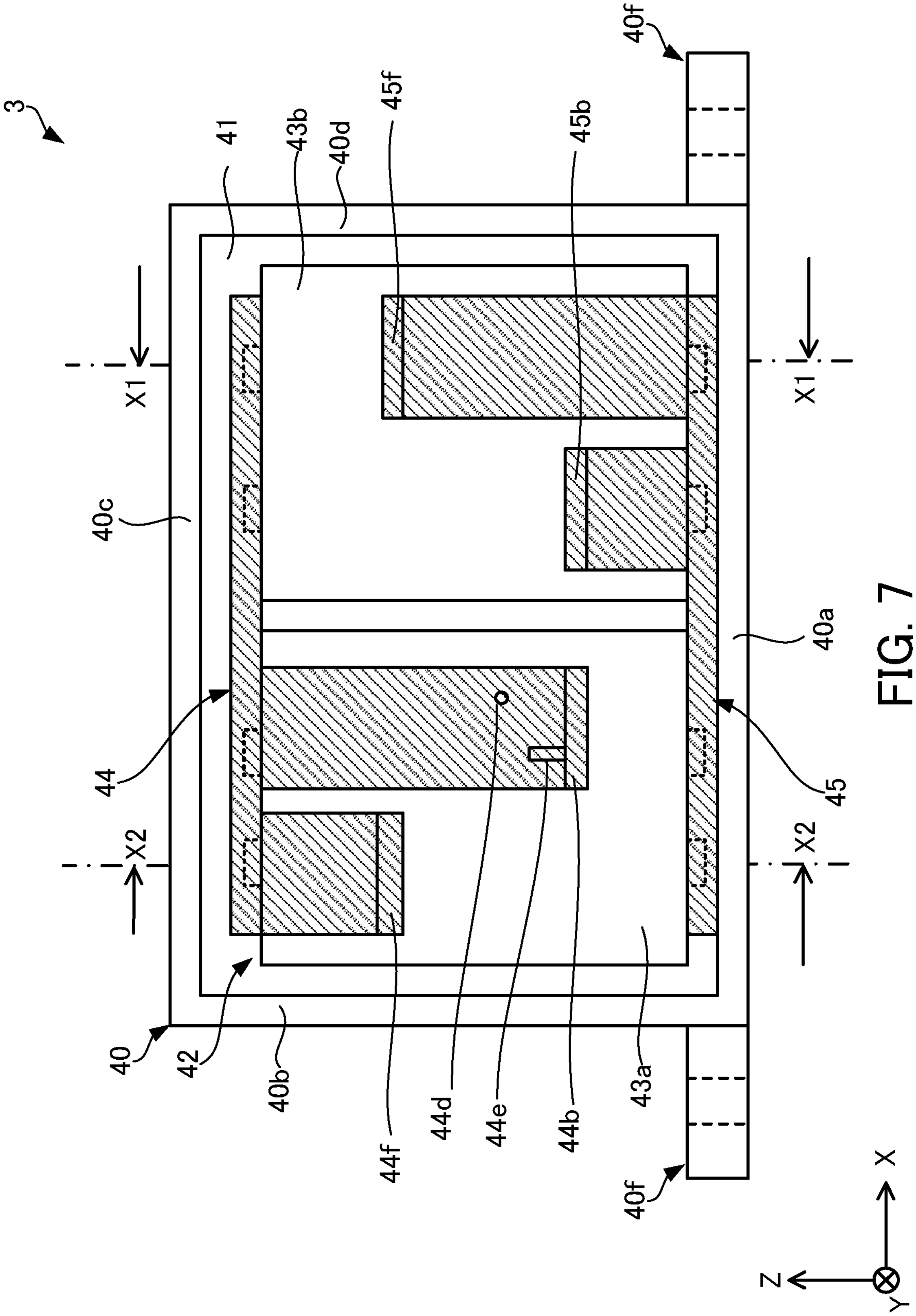
FIG. 7 is a side view of the capacitor device (without sealing) according to the first embodiment.
Figure 8B:
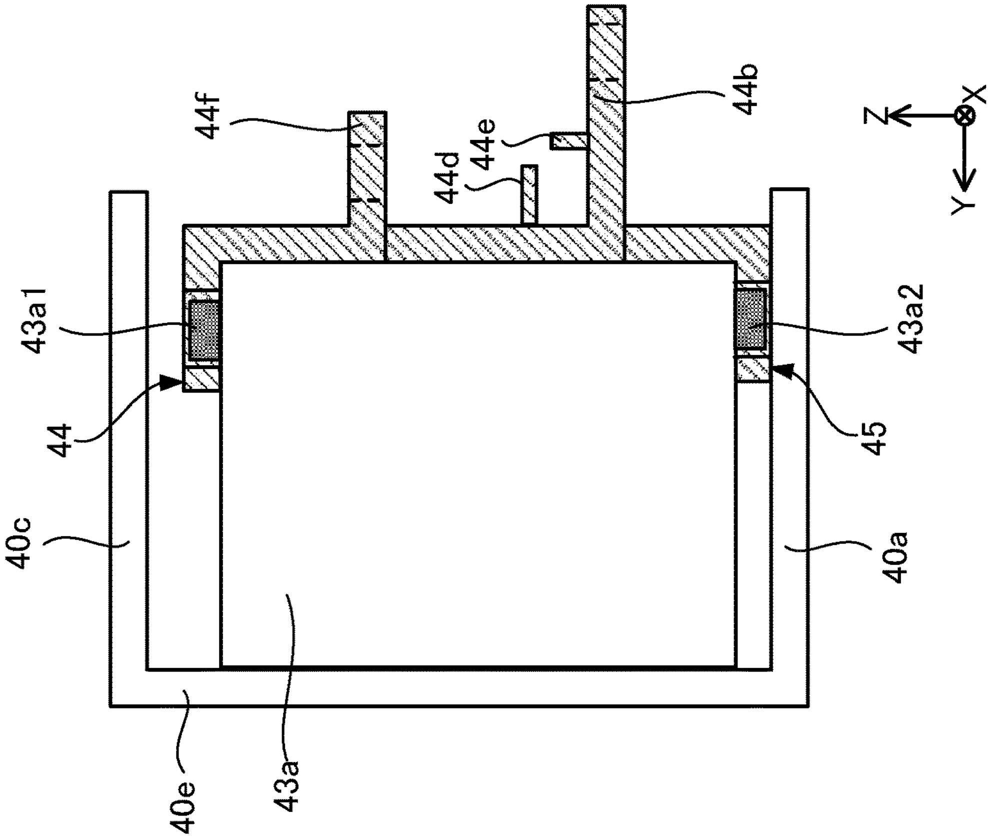
FIGS. 8A and 8B are sectional views of the capacitor device according to the first embodiment.
Figure 8A:
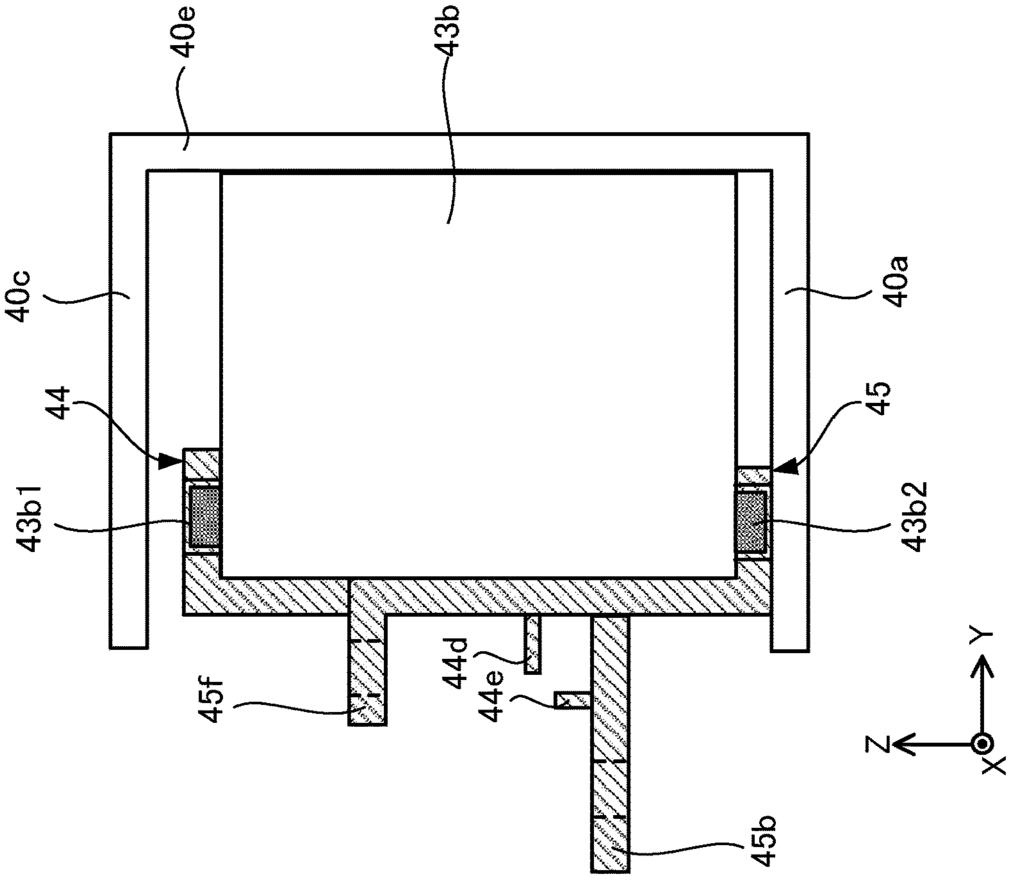
Figure 9A:
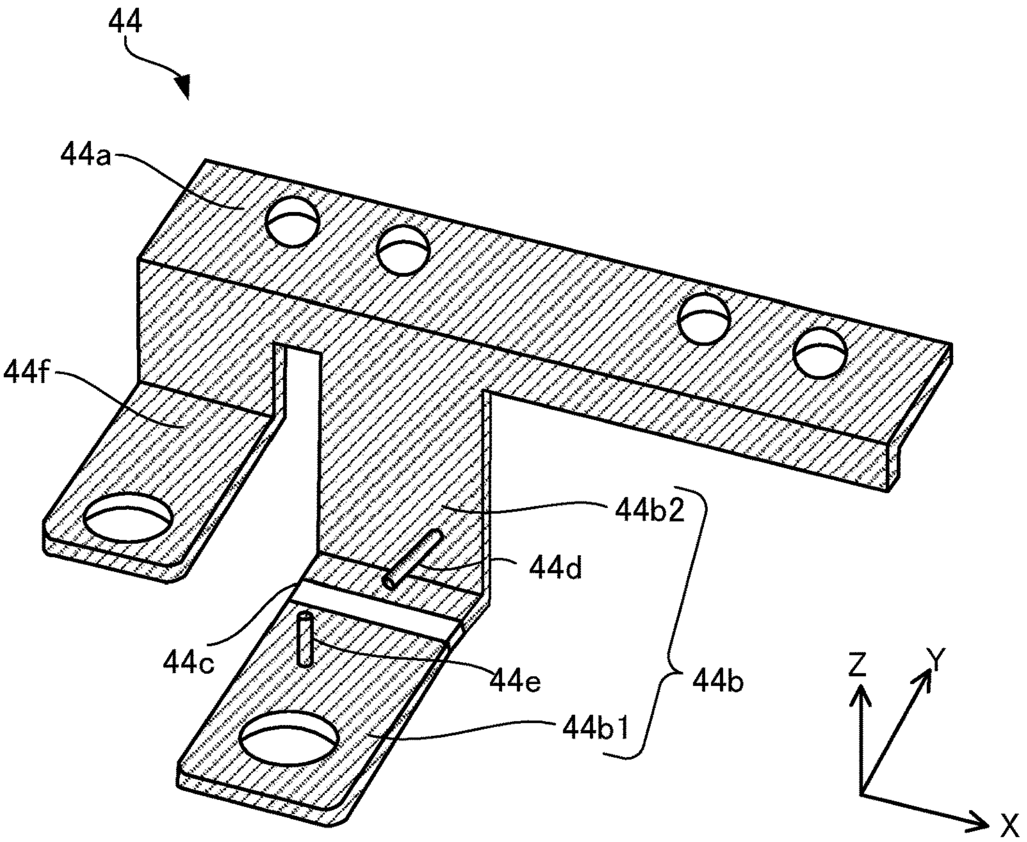
FIGS. 9A and 9B illustrate lead frames included in the capacitor device according to the first embodiment.
Figure 9B:
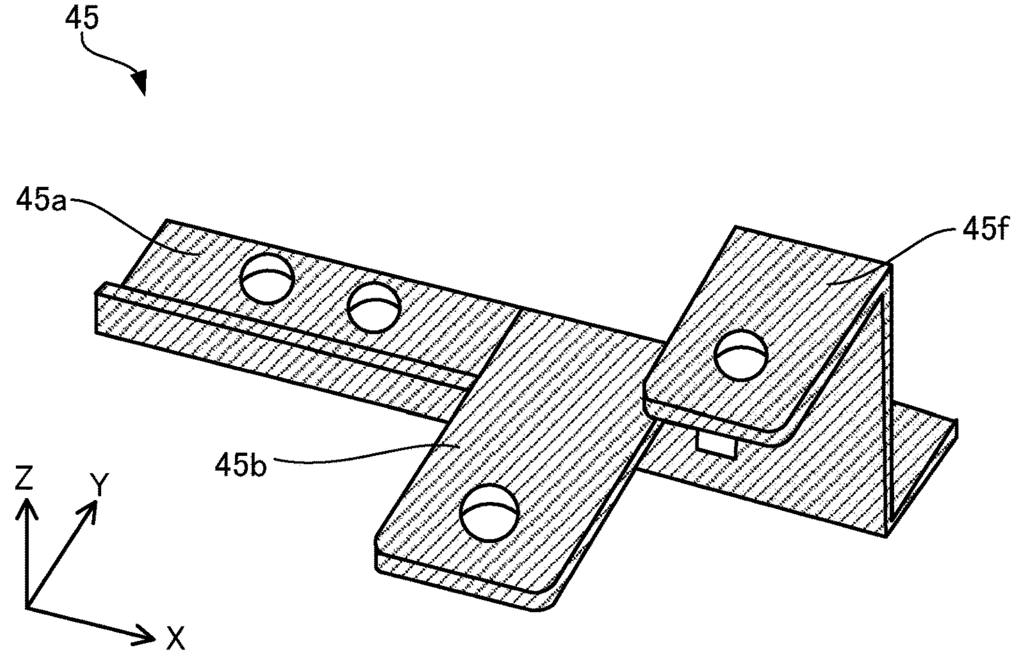

The following describes the capacitor device 3 included in the current detection system 1 with reference to FIGS. 6 to 9B. FIG. 6 is a side view of the capacitor device (with sealing) according to the first embodiment. FIG. 7 is a side view of the capacitor device (without sealing) according to the first embodiment. FIGS. 8A and 8B are sectional views of the capacitor device according to the first embodiment. FIGS. 9A and 9B illustrate lead frames included in the capacitor device according to the first embodiment.

In this connection, FIG. 6 is a side view of the capacitor device 3 seen in the +Y direction. FIG. 7 illustrates the case (without sealing) where a sealing member 46 is removed in FIG. 6. FIGS. 8A and 8B are sectional views taken along dash-dotted lines X1-X1 and X2-X2 of FIG. 7.

The capacitor device 3 includes a case 40, a capacitor unit 42 housed in a storage space 41 of the case 40, and the sealing member 46 filling the storage space 41. In this case, end portions of a first wiring 44*b* and first power supply terminal 44*f* of a first lead frame 44 and end portions of a second wiring 45*b* and second power supply terminal 45*f* of a second lead frame 45, which are included in the capacitor unit 42, are exposed from the sealing member 46. In addition, an end portion of a first detection terminal 44*d* included in the first wiring 44*b* of the first lead frame 44 is exposed from the sealing member 46. A second detection terminal 44*e* included in the first wiring 44*b* of the first lead frame 44 is not sealed with the sealing member 46.

The case 40 has a box shape, and has the storage space 41 defined by a bottom surface 40*a*, a side surface 40*b*, a top surface 40*c*, a side surface 40*d*, and back surface 40*e*. In addition, fixing portions 40*f* are provided on the side surfaces 40*b* and 40*d* of the case 40 such that they are flush with the bottom surface 40*a*. The capacitor device 3 is fixed at a predetermined position by tightening screws into the fixing portions 40*f*. The storage space 41 has such a size as to house the capacitor unit 42 that will be described later.

The case 40 is formed by injection molding using a thermoplastic resin. Examples of the thermoplastic resin include a polyphenylene sulfide resin, a polybutylene terephthalate resin, a polybutylene succinate resin, a polyamide resin, and an acrylonitrile butadiene styrene resin.

The capacitor unit 42 further includes capacitor elements 43*a* and 43*b*, the first lead frame 44, and the second lead frame 45. The capacitor elements 43*a* and 43*b* each include a capacitor body including a positive electrode and a negative electrode, a storage container housing the capacitor body, and an electrode 43*a*1 or 43*a*2 and electrode 43*b*1 or 43*b*2 exposed from the storage container. In this connection, in the present embodiment, the case where the capacitor unit 42 includes the two capacitor elements 43*a* and 43*b* is exemplified. The number of capacitor elements 43*a* and 43*b* is not limited to two, but may be one or three or more. In addition, each capacitor element 43*a* and 43*b* has a capacitance ranging from 50 μF to 1000 μF, inclusive, and a withstand voltage ranging from 50 V to 1000 V, inclusive.

For example, each capacitor body is formed by laminating and winding a film around a dielectric made of aluminum as a main component. In addition, each capacitor body includes a positive electrode and a negative electrode. Each storage container is insulating and has, for example, a cylindrical shape to house one of the capacitor bodies. In addition, the electrode 43*a*1 or 43*b*1 and the electrode 43*a*2 or 43*b*2 are provided respectively on the front surface and rear surface of each storage container, and are connected respectively to the positive electrode and negative electrode of each capacitor body.

The first lead frame 44 and second lead frame 45 are made of a metal with high electrical conductivity. Examples of the metal here include copper, aluminum, and an alloy containing at least one of these. Plating may be performed on the surfaces of the first lead frame 44 and second lead frame 45 to improve their corrosion resistance. Examples of the plating material used here include nickel, a nickel-phosphorus alloy, and a nickel-boron alloy.

The first lead frame 44 includes a first electrode connection portion 44*a*, the first wiring 44*b*, a resistor part 44*c*, the first detection terminal 44*d*, the second detection terminal 44*e*, and the first power supply terminal 44*f*. The first electrode connection portion 44*a* is provided at the front part of the front surfaces of the arrayed capacitor elements 43*a* and 43*b* and is bonded to the electrodes 43*a*1 and 43*b*1 of the capacitor elements 43*a* and 43*b*. For example, the first electrode connection portion 44*a* is has an L shape, into which a flat plate is deformed, and is bonded.

The first wiring 44*b* has one end portion (first one end portion) connected to the first electrode connection portion 44*a*, and has the other end portion (first other end portion) protruding outward (in the −Y direction) from the first electrode connection portion 44*a* in plan view. In this connection, the first wiring 44*b* is connected to an inner position of the first electrode connection portion 44*a* than the −X-side end portion of the first electrode connection portion 44*a*. The first wiring 44*b* has an L shape, for example. The first wiring 44*b* is bent in the middle in such a manner that the one end portion thereof connected to the first electrode connection portion 44*a* extends in the −Z direction along the capacitor element 43*a* and the other end portion thereof extends in the −Y direction. In addition, the first wiring 44*b* includes a wiring portion (second portion) 44*b*1 and a wiring portion (first portion) 44*b*2 with the resistor part 44*c* therebetween.

The resistor part 44*c* is sandwiched by the one end portion and the other end portion of the first wiring 44*b* and is connected directly to the first wiring 44*b*. For example, the resistor part 44*c* has a resistance ranging from 0.01 mΩ to 1 mΩ, inclusive. The resistor part 44*c* is, for example, a shunt resistor and has a cuboid shape. In this connection, the resistor part 44*c* may have a cube shape. For example, the thickness of the resistor part 44*c* is approximately equal to that of the first wiring 44*b*. The width in the ±X directions of the resistor part 44*c* is approximately equal to the width in the ±X directions of the first wiring 44*b*. In this connection, the shape and position of the resistor part 44*c* are illustrated just as an example. The resistor part 44*c* is sandwiched between the wiring portions 44*b*1 and 44*b*2 of the first wiring 44*b* and is included in the first wiring 44*b*. For example, the resistor part 44*c* may be joined to the wiring portions 44*b*1 and 44*b*2 of the first wiring 44*b* by welding. The first detection terminal 44*d* and second detection terminal 44*e* are made of a metal with high electrical conductivity that is, for example, copper. The first detection terminal 44*d* and second detection terminal 44*e* are, for example, pin-shaped and are bonded to the first wiring 44*b*. Alternatively, the first detection terminal 44*d* and second detection terminal 44*e* may be formed on the first wiring 44*b* using the aforementioned material through plating or deposition.

In addition, the first detection terminal 44*d* and second detection terminal 44*e* are formed at positions with the resistor part 44*c* therebetween on the first wiring 44*b*. More specifically, the first detection terminal 44*d* is located adjacent to the resistor part 44*c* on the one end portion side of the first wiring 44*b* (on the side where the first electrode connection portion 44*a* is located). The second detection terminal 44*e* is located adjacent to the resistor part 44*c* on the other end portion side of the first wiring 44*b* (on the side away from the first electrode connection portion 44*a*). In this connection, the first detection terminal 44*d* and second detection terminal 44*e* may be provided at positions relocated in the ±X directions. In addition, the shapes and positions of the first detection terminal 44*d* and second detection terminal 44*e* are illustrated just as an example, and are not limited to thereto as long as they are connectable to the current detection device as described later. In the example here, the first detection terminal 44*d* is formed on the wiring portion 44*b*2 of the first wiring 44*b*, and the second detection terminal 44*e* is formed on the wiring portion 44*b*1 of the first wiring 44*b*. For example, in the case where the resistor part 44*c* is formed in the wiring portion 44*b*2 of the first wiring 44*b*, the first detection terminal 44*d* and second detection terminal 44*e* may be formed at positions with the resistor part 44*c* therebetween on the wiring portion 44*b*2 of the first wiring 44*b*.

In this connection, the resistor part 44*c* may be provided in either the first wiring 44*b* or the second wiring 45*b* that will be described later. The resistor part 44*c* may be provided in the second wiring 45*b* in the same manner as provided in the first wiring 44*b*. In the case where the resistor part 44*c* is provided in the second wiring 45*b*, the first detection terminal 44*d* and second detection terminal 44*e* may also be formed on the second wiring 45*b* in the same manner as provided on the first wiring 44*b*.

The first power supply terminal 44*f* has one end portion connected to the −X-side end portion of the first electrode connection portion 44*a*, and has the other end portion protruding outward (in the −Y direction) from the first electrode connection portion 44*a* in plan view. For example, the first power supply terminal 44*f* has an L shape. The first power supply terminal 44*f* is bent in the middle in such a manner that the one end portion thereof connected to the first electrode connection portion 44*a* extends in the −Z direction along the capacitor element 43*a* and the other end portion thereof extends in the −Y direction. In this case, the other end portion of the first power supply terminal 44*f* is located above (in the +Z direction) the other end portion of the first wiring 44*b*. This first power supply terminal 44*f* is electrically connected to the one end portion of the first wiring 44*b* via the first electrode connection portion 44*a*.

The second lead frame 45 includes a second electrode connection portion 45*a*, the second wiring 45*b*, and the second power supply terminal 45*f*. The second electrode connection portion 45*a* is provided at the front part of the rear surfaces of the arrayed capacitor elements 43*a* and 43*b* and is bonded to the electrodes 43*a*2 and 43*b*2 of the capacitor elements 43*a* and 43*b*. For example, the second electrode connection portion 45*a* has an L shape, into which a flat plate is deformed, and is bonded.

The second wiring 45*b* has one end portion (second one end portion) connected to the second electrode connection portion 45*a*, and has the other end portion (second other end portion) protruding outward (in the −Y direction) from the second electrode connection portion 45*a* in plan view. In this connection, the second wiring 45*b* is connected to an inner position of the second electrode connection portion 45*a* than the +X-side end portion of the second electrode connection portion 45*a*. For example, the second wiring 45*b* has an L shape. The second wiring 45*b* is bent in the middle in such a manner that the one end portion thereof connected to the second electrode connection portion 45*a* extends in the +Z direction along the capacitor element 43*b* and the other end portion thereof extends in the −Y direction.

The second power supply terminal 45*f* has one end portion connected to the +X-side end portion of the second electrode connection portion 45*a*, and has the other end portion protruding outward (in the −Y direction) from the second electrode connection portion 45*a* in plan view. For example, the second power supply terminal 45*f* has an L shape. The second power supply terminal 45*f* is bent in the middle in such a manner that the one end portion thereof connected to the second electrode connection portion 45*a* extends in the +Z direction along the capacitor element 43*b* and the other end portion thereof extends in the −Y direction. In this case, the other end portion of the second power supply terminal 45*f* is located above (in the +Z direction) the other end portion of the second wiring 45*b*. The second power supply terminal 45*f* is electrically connected to the one end portion of the second wiring 45*b* via the second electrode connection portion 45*a*.

The sealing member 46 may be a thermosetting resin. Examples of the thermosetting resin include an epoxy resin, a phenolic resin, a maleimide resin, and a polyester resin, and is preferably an epoxy resin. In addition, the sealing member 46 may contain a filler as an additive. The filler may contain insulating ceramics with high thermal conductivity. The sealing member 46 fills the storage space 41 of the case 40 to seal the capacitor elements 43*a* and 43*b*. In addition, the first lead frame 44 and second lead frame 45 are sealed, with the other end portion of the first wiring 44*b* and the other end portion of the first power supply terminal 44*f* of the first lead frame 44 and the other end portion of the second wiring 45*b* and the other end portion of the second power supply terminal 45*f* of the second lead frame 45 exposed. The resistor part 44*c* is also sealed with the sealing member 46. Note that, in the present embodiment, an end portion (a tip end of the first detection terminal 44*d* on the side away from the first wiring 44*b*) of the first detection terminal 44*d* is exposed from the sealing member 46. The second detection terminal 44*e* is not sealed with the sealing member 46. Even in the case where the second detection terminal 44*e* is sealed with the sealing member 46 as well, a tip end of the second detection terminal 44*e* on the side away from the first wiring 44*b* needs to be exposed from the sealing member 46. For example, in the case where the resistor part 44*c* is formed in the wiring portion 44*b*2 of the first wiring 44*b* as described earlier, the end portions of both the first detection terminal 44*d* and second detection terminal 44*e* formed on the wiring portion 44*b*2 of the first wiring 44*b* are exposed from the sealing member 46.

Figure 10:
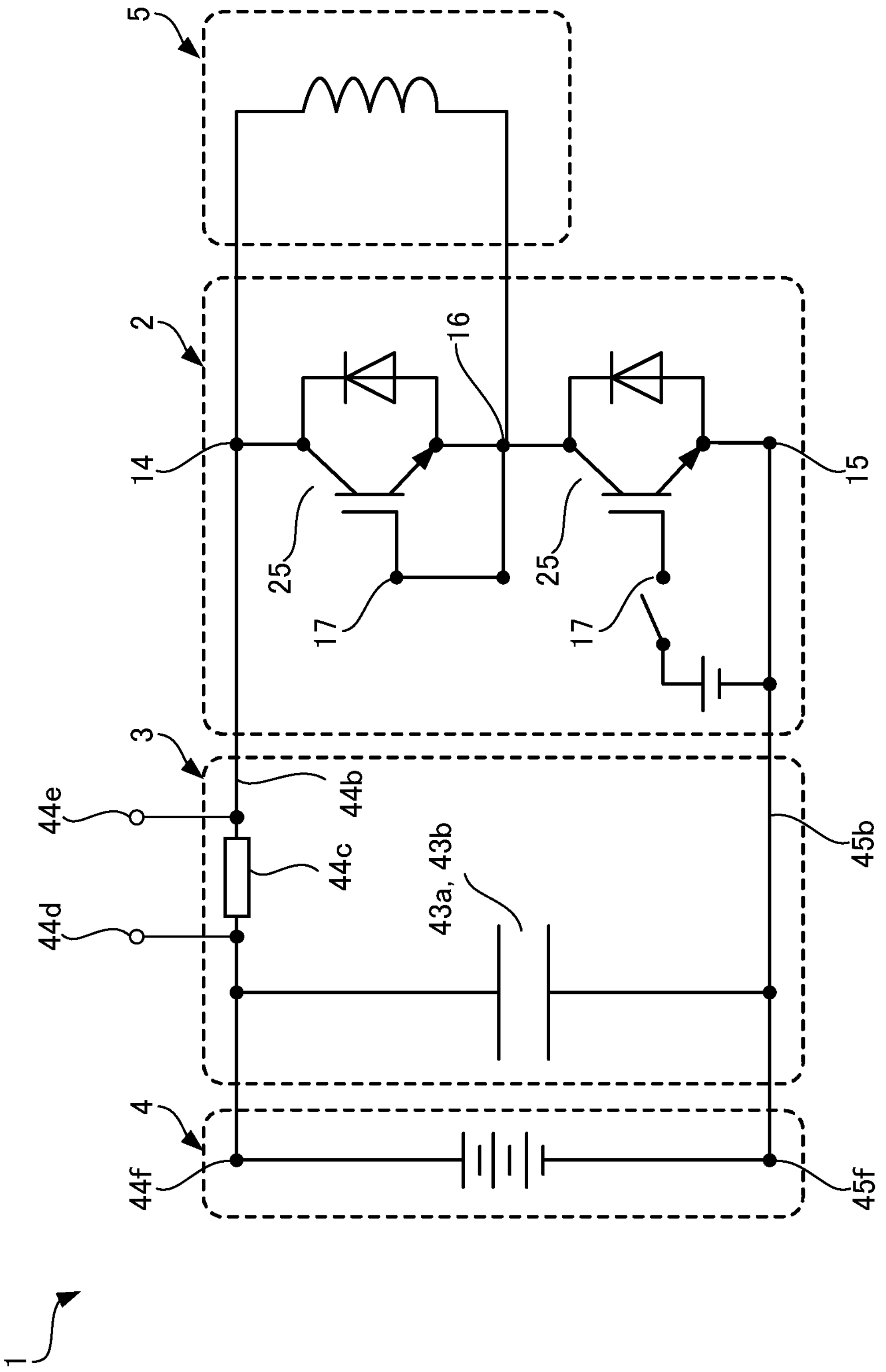
FIG. 10 is an equivalent circuit diagram of the current detection system according to the first embodiment.

The following describes an equivalent circuit diagram of the current detection system 1 including the above-described capacitor device 3 with reference to FIG. 10. FIG. 10 is an equivalent circuit diagram of the current detection system according to the first embodiment.

As described earlier, the current detection system 1 includes the semiconductor device 2, capacitor device 3, power supply device 4, inductance device 5, and current detection device 6. In this connection, the illustration of the current detection device 6 is omitted in FIG. 10.

As seen in the equivalent circuit diagram of the current detection system 1 of FIG. 10, the resistor part 44*c* is included in the first wiring 44*b* connected to the capacitor elements 43*a* and 43*b* (positive electrodes thereof) of the capacitor device 3. The current detection device 6, whose illustration is omitted, is connected to the first detection terminal 44*d* and second detection terminal 44*e* and detects a current flowing through the resistor part 44*c*.

Figure 11:
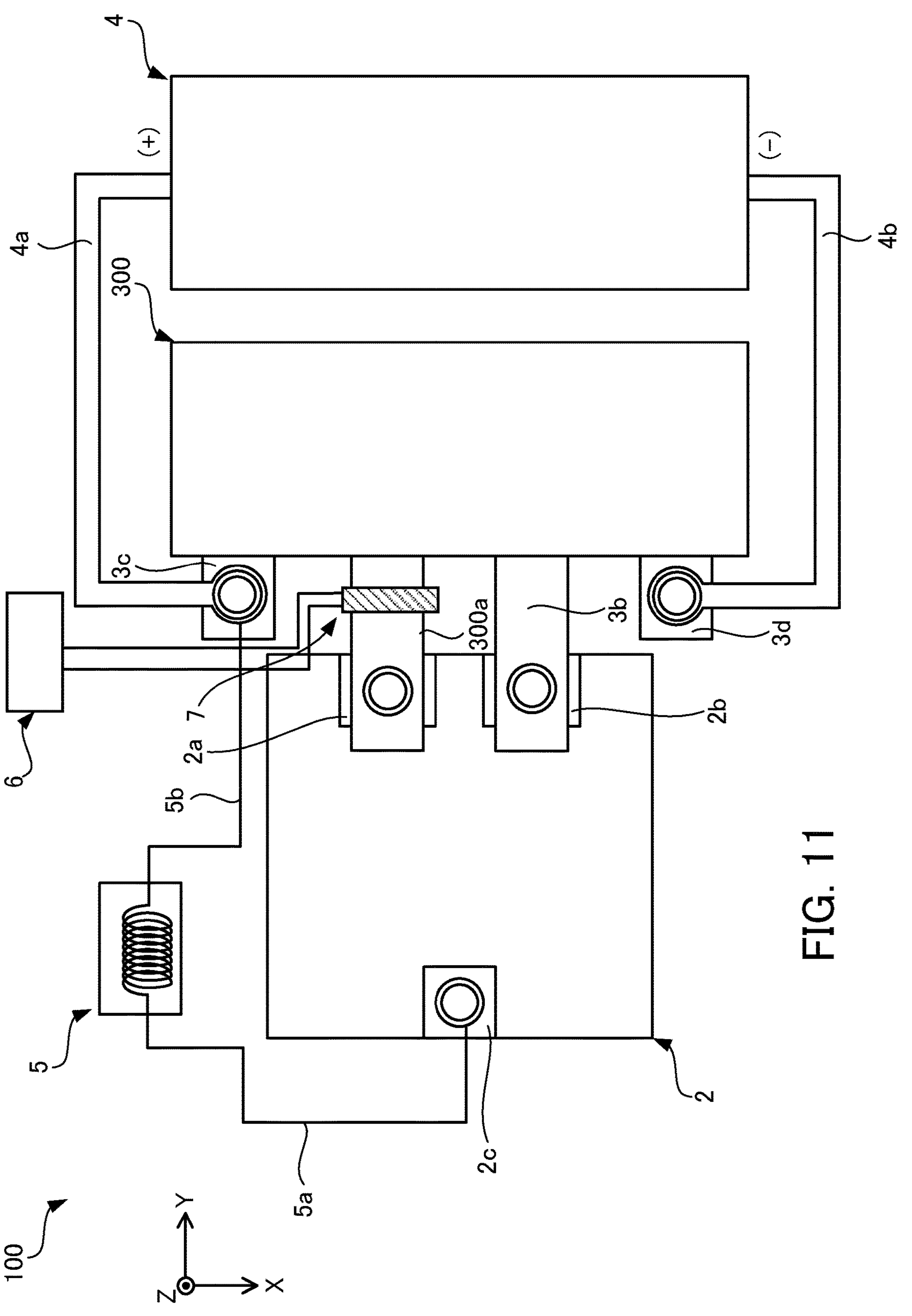
FIG. 11 illustrates a current detection system according to a first reference example.
Figure 12:
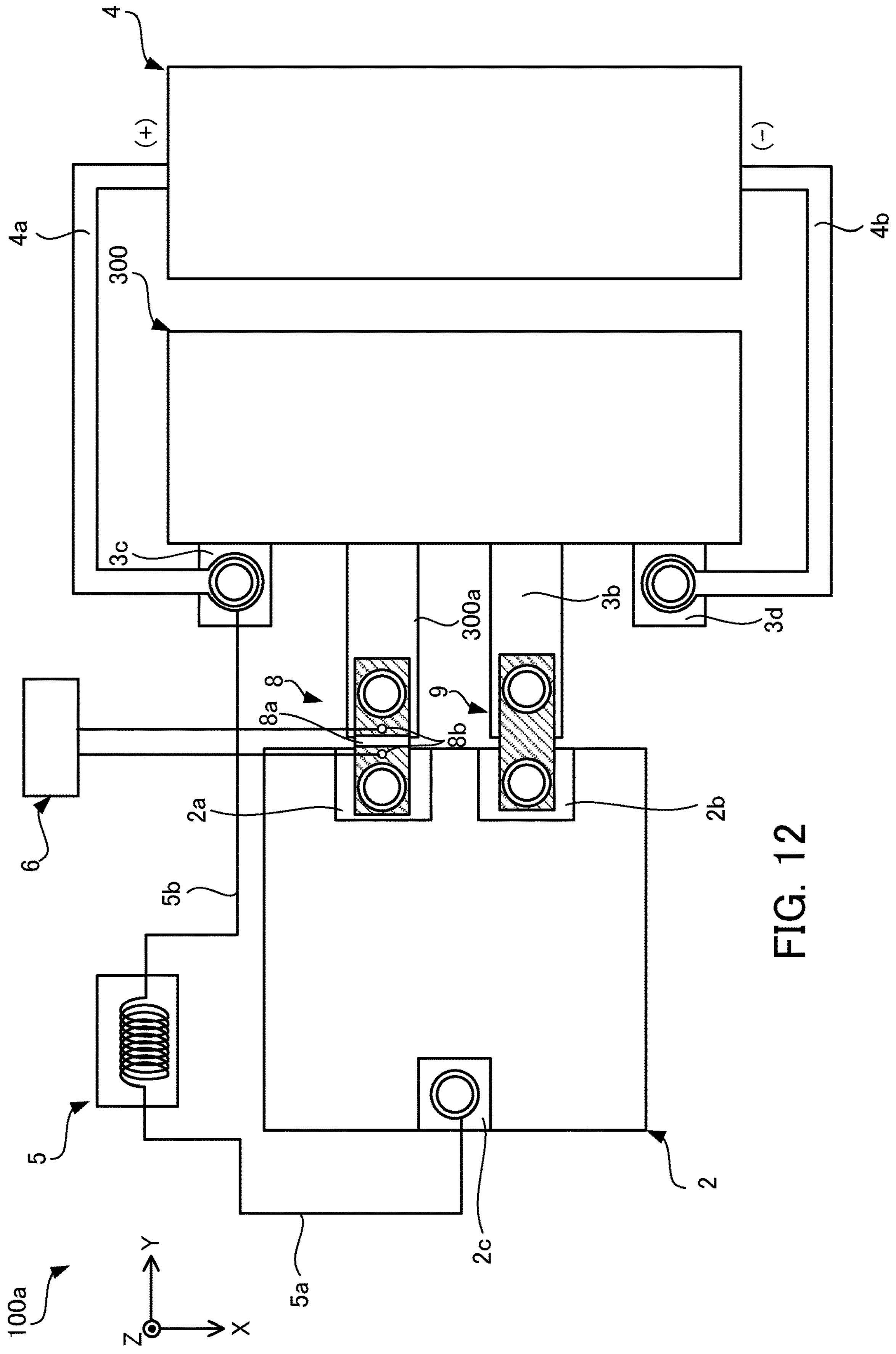
FIG. 12 illustrates a current detection system according to a second reference example.

The following describes other current detection methods as reference examples for the current detection system 1 of the first embodiment, with reference to FIGS. 11 and 12. FIG. 11 illustrates a current detection system according to a first reference example, and FIG. 12 illustrates a current detection system according to a second reference example.

The current detection systems 100 and 100*a* illustrated in FIGS. 11 and 12 each include the semiconductor device 2 as a detection target, a capacitor device 300, the power supply device 4, the inductance device 5, and the current detection device 6. Note that a first wiring 300*a* of the capacitor device 300 of the first reference example is a wiring obtained by removing the resistor part 44*c*, first detection terminal 44*d*, and second detection terminal 44*e* from the capacitor device 3 of the first embodiment.

In the first reference example of FIG. 11, the first electrode terminal 2*a* of the semiconductor device 2 and the first electrode connection portion 44*a* (electrodes 43*a*1 and 43*b*1 (reference numerals omitted) of the capacitor elements 43*a* and 43*b*) of the capacitor device 300 are connected to each other in the shortest distance. A Rogowski coil may be used as a current sensor 7, for example. The current detection device 6 detects a voltage of the current sensor 7 that is proportional to a current flowing through the first wiring 300*a*.

This current detection system 100 has slow response time due to the inherent limitations of the current sensor 7, and is therefore unable to track a rapidly changing signal. Especially, when the semiconductor chips 25 made of silicon carbide as a main component operate at high speed, measurement errors become significant. Consequently, the current detection device 6 produces detection results in low accuracy, which makes it difficult to perform proper electrical characteristic evaluation.

In addition, in the second reference example of FIG. 12, the first electrode terminal 2*a* of the semiconductor device 2 and the first wiring 300*a* of the capacitor device 300 are connected to each other via a connection plate 8 including the resistor part 8*a* and a pair of detection terminals 8*b*. The second electrode terminal 2*b* of the semiconductor device 2 and the second wiring 3*b* of the capacitor device 300 are connected to each other via a connection plate 9. The connection plates 8 and 9 are made of a metal with high electrical conductivity. The metal used here has been described earlier. The resistor part 8*a* included in the connection plate 8 is a shunt resistor, for example. The width in the ±X directions of the connection plate 8 is approximately identical to the width in the ±X directions of the resistor part 8*a*. The current detection device 6 is connected to the pair of detection terminals 8*b* of the connection plate 8, which have the resistor part 8*a* therebetween. The current detection device 6 detects a current flowing through the connection plate 8. In this connection, the resistor part 8*a* may be provided in either the connection plate 8 or 9. In the case where the resistor part 8*a* is provided in the connection plate 9, the current detection device 6 detects a current flowing through the connection plate 9 having the resistor part 8*a* therein.

The above current detection system 100*a* includes the connection plate 8 including the resistor part 8*a* between the first electrode terminal 2*a* of the semiconductor device 2 and the first wiring 300*a* of the capacitor device 300. Therefore, stray inductance generated in the connection plate 8 increases, which causes a change in the electrical characteristics. Consequently, the current detection device 6 produces detection results in low accuracy, which makes it difficult to perform proper electrical characteristic evaluation.

In contrast to the above-described current detection systems 100 and 100*a*, the capacitor device 3 of the first embodiment includes the capacitor elements 43*a* and 43*b*, first wiring 44*b*, and second wiring 45*b*. The first wiring 44*b* has one end portion connected to the electrodes 43*a*1 and 43*b*1, which are for example positive electrodes, of the capacitor elements 43*a* and 43*b* and the other end portion connected to the first electrode terminal 14 included in the semiconductor device 2. The second wiring 45*b* has one end portion connected to the electrodes 43*a*2 and 43*b*2, which are for example negative electrodes, of the capacitor elements 43*a* and 43*b* and the other end portion connected to the second electrode terminal 15 included in the semiconductor device 2. In addition, the resistor part 44*c* is included between the one end portion and the other end portion of the first wiring 44*b* and is electrically connected directly to the first wiring 44*b*. In this manner, in the capacitor device 3, the resistor part 44*c* is directly provided in the first wiring 44*b*. Therefore, the first wiring 44*b* may be connected directly to the first electrode terminal 14 of the semiconductor device 2 without anything interposed therebetween, which makes it possible to reduce an increase in the stray inductance between the first wiring 44*b* and the first electrode terminal 14 of the semiconductor device 2. In addition, since the resistor part 44*c* is a shunt resistor, a reduction in the response speed due to the inherent limitations of a Rogowski coil, which may occur in the case of using the Rogowski coil, and an inability to track a rapidly changing signal are prevented.

Therefore, with the use of the capacitor device 3, the current detection system 1 improves the detection accuracy of a current flowing in the semiconductor device 2. The use of such detection results improves the accuracy of reliability evaluation of the semiconductor device 2.

In addition, in the capacitor device 3, the resistor part 44*c* included in the first wiring 44*b* is sealed with the sealing member 46 inside the case 40. That is, the resistor part 44*c* is fixed by the sealing member 46. Therefore, when and after the first wiring 44*b* is bonded to the first electrode terminal 14 of the semiconductor device 2, external stress exerted on the resistor part 44*c* through the first wiring 44*b* is alleviated. Thus, it is possible to protect the resistor part 44*c* reliably, which in turn ensures the long-term durability of the resistor part 44*c*.

SECOND EMBODIMENT

The semiconductor device 2 including two semiconductor chips 25 is used as an example of a detection target in the current detection system 1 of the first embodiment. On the other hand, in a current detection system (whose illustration is omitted) of a second embodiment, the case of using a semiconductor device including six semiconductor chips, that is, a semiconductor device including three semiconductor devices 2 each of which is the same as used in the first embodiment will be described with reference to FIG. 13.

Figure 13:
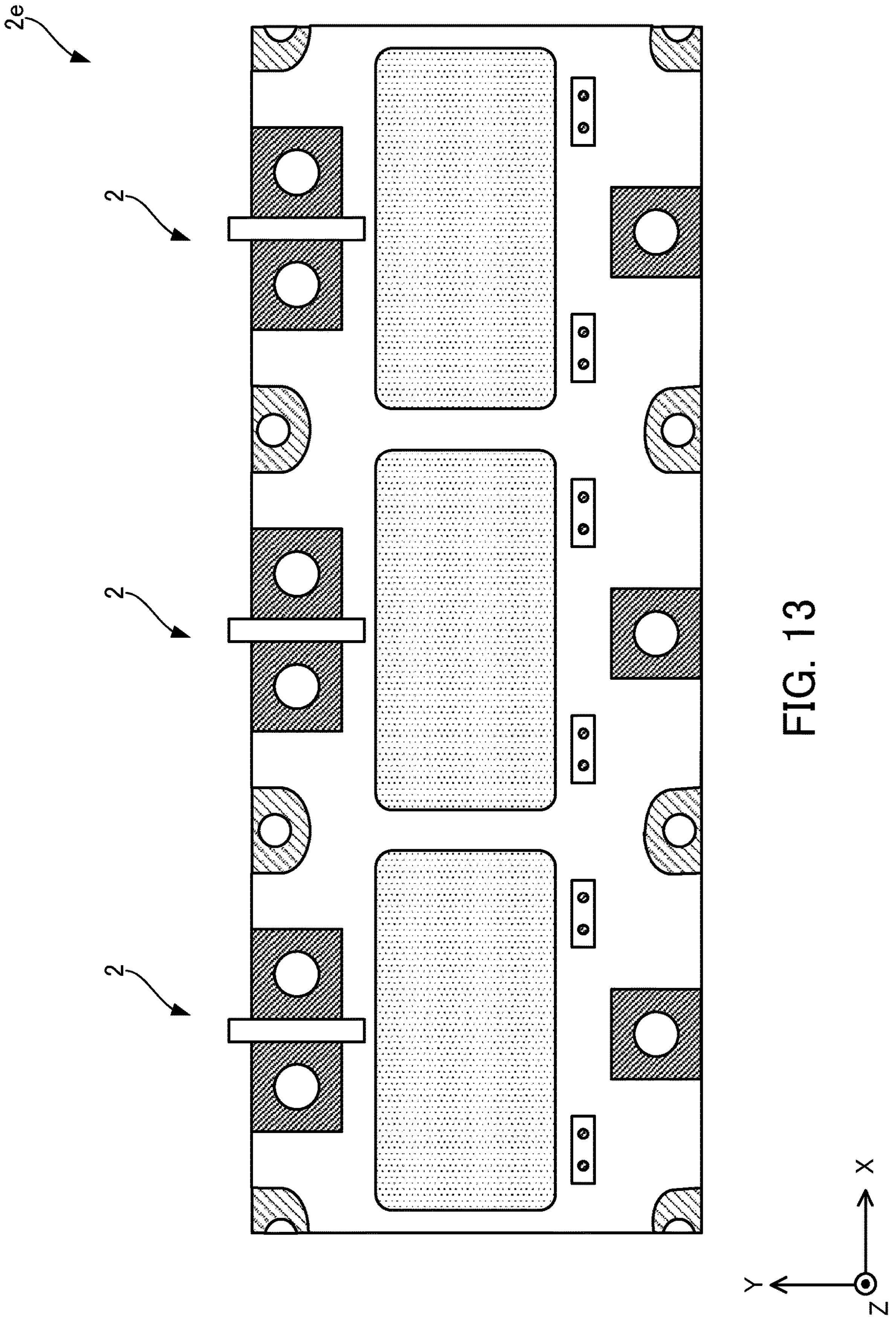
FIG. 13 is a plan view of a semiconductor device (with sealing) according to a second embodiment.

FIG. 13 is a plan view of a semiconductor device (with sealing) according to the second embodiment. The semiconductor device 2*e* of the second embodiment includes three semiconductor devices 2 each of which is the same as used in the first embodiment. The reference numerals of the components of the semiconductor devices 2 are not indicated in FIG. 13 (see FIGS. 2 to 4). In the semiconductor device 2*e*, the three semiconductor devices 2 are arranged such that their first electrode terminals 14 and second electrode terminals 15 are aligned and their output terminals 16 are aligned. At this time, the cases 10 of the three semiconductor devices 2 are integrally connected to one another, and the heat dissipation plates 13 thereof are integrally connected to one another as well.

Figure 14:
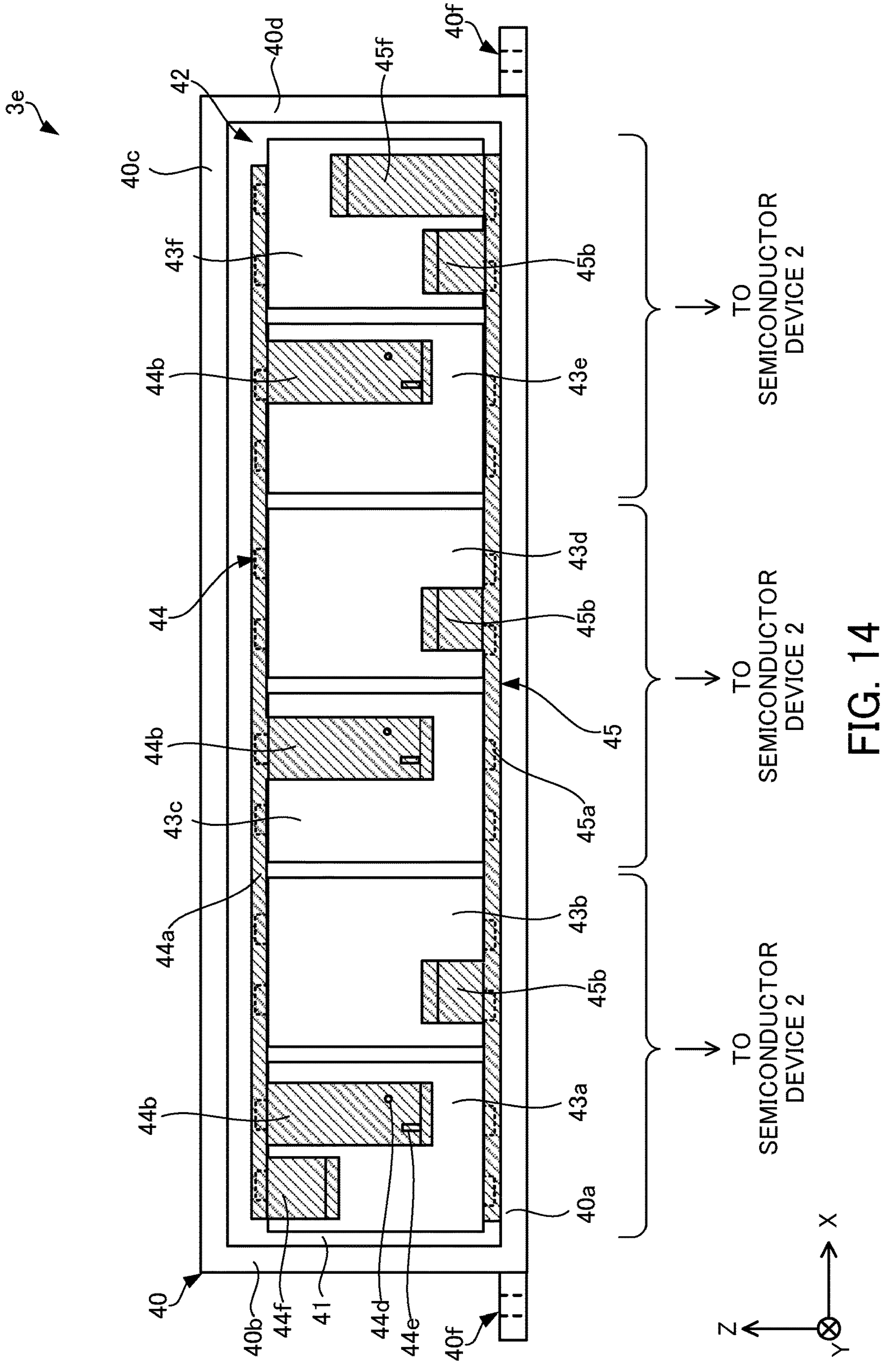
FIG. 14 is a side view of a capacitor device (without sealing) according to the second embodiment.

The following describes a capacitor device connected to the semiconductor device 2*e* in the current detection system of the second embodiment with reference to FIG. 14. FIG. 14 is a side view of the capacitor device (without sealing) according to the second embodiment. In this connection, not all reference numerals of the components of the capacitor device 3 are indicated in FIG. 14 (see FIGS. 6 to 9B).

A capacitor device 3*e* includes three capacitor devices 3, which are the same as used in the first embodiment. The capacitor device 3*e* also includes a case 40, a capacitor unit 42 housed in the storage space 41 of the case 40, and a sealing member 46 sealing the inside of the storage space 41. The illustration of the sealing member 46 is omitted in FIG. 14.

In addition, as in the first embodiment, end portions of first wirings 44*b* and an end portion of a first power supply terminal 44*f* of a first lead frame 44 and end portions of second wirings 45*b* and an end portion of a second power supply terminal 45*f* of a second lead frame 45, which are included in the capacitor unit 42, are exposed from the sealing member 46. Furthermore, end portions of first detection terminals 44*d* included in the first wirings 44*b* of the first lead frame 44 are exposed from the sealing member 46. Second detection terminals 44*e* included in the first wirings 44*b* of the first lead frame 44 are not sealed with the sealing member 46.

As in the first embodiment, the case 40 has a box shape with a bottom surface 40*a*, a side surface 40*b*, a top surface 40*c*, a side surface 40*d*, and a back surface (reference numeral omitted) that define the storage space 41. Fixing portions 40*f* are provided on the side surfaces 40*b* and 40*d* of the case 40 such that they are flush with the bottom surface 40*a*. The storage space 41 may have such a size as to house the capacitor unit 42. The case 40 is formed by injection molding using a thermoplastic resin, in the same manner as in the first embodiment.

The capacitor unit 42 also includes three sets of capacitor elements 43*a* and 43*b*, 43*c* and 43*d*, and 43*e* and 43*f*, the first lead frame 44, and the second lead frame 45. Each set of capacitor elements 43*a* and 43*b*, 43*c* and 43*d*, and 43*e* and 43*f* have the same configuration as the capacitor elements 43*a* and 43*b* of the first embodiment.

The first lead frame 44 and second lead frame 45 are made of a metal with high electrical conductivity, as in the first embodiment. The first lead frame 44 includes a first electrode connection portion 44*a*, first wirings 44*b*, resistor parts (not illustrated), first detection terminals 44*d*, second detection terminals 44*e*, and first power supply terminal 44*f*, as in the first embodiment. Note that the first lead frame 44 includes three first wirings 44*b*. In addition, a resistor part (not illustrated), a first detection terminal 44*d*, and a second detection terminal 44*e* may be provided in each of at least two of the three first wirings 44*b*.

The first electrode connection portion 44*a* is provided at the front part of the front surfaces of three sets of arrayed capacitor elements 43*a* and 43*b*, 43*c* and 43*d*, and 43*e* and 43*f* and is bonded to the electrodes (reference numerals omitted) of the capacitor elements 43*a* and 43*b*, 43*c* and 43*d*, and 43*e* and 43*f*. For example, the first electrode connection portion 44*a* has an L shape, into which a flat plate is deformed, and is bonded.

The first wirings 44*b* each have one end portion (first one end portion) connected to one of three positions of the first electrode connection portion 44*a* and have the other end portion (first other end portion) protruding outward (in the −Y direction) from the first electrode connection portion 44*a* in plan view. For example, the first wiring 44*b* located furthest in the −X direction is located on an inner side than the −X-side end portion of the first electrode connection portion 44*a*. Each first wiring 44*b* is bent in the middle in such a manner that the one end portion thereof connected to the first electrode connection portion 44*a* extends in the −Z direction along the corresponding one of the capacitor elements 43*a*, 43*c*, and 43*e* and the other end portion thereof extends in the −Y direction. In addition, each first wiring 44*b* has an L shape. The first wirings 44*b* each include a resistor part, a first detection terminal 44*d*, and a second detection terminal 44*e*, as in the first embodiment.

The first power supply terminal 44*f* has one end portion connected to the −X-side end portion of the first electrode connection portion 44*a*, and has the other end portion protruding outward (in the −Y direction) from the first electrode connection portion 44*a* in plan view, as in the first embodiment.

The second lead frame 45 includes a second electrode connection portion 45*a*, second wirings 45*b*, and a second power supply terminal 45*f*. In this connection, the second lead frame 45 includes three second wirings 45*b*.

The second electrode connection portion 45*a* is provided at the front part of the rear surfaces of the arrayed capacitor elements 43*a* and 43*b*, 43*c* and 43*d*, and 43*e* and 43*f*, and is bonded to the electrodes (reference numerals omitted) of the capacitor elements 43*a* and 43*b*, 43*c* and 43*d*, and 43*e* and 43*f*. For example, the second electrode connection portion 45*a* has an L shape, into which a flat plate is deformed, and is bonded.

The second wirings 45*b* each have one end portion (second one end portion) connected to one of three positions of the second electrode connection portion 45*a* and have the other end portion (second other end portion) protruding outward (in the −Y direction) from the second electrode connection portion 45*a* in plan view. For example, the second wiring 45*b* located furthest in the +X direction is located on an inner side than the +X-side end portion of the second electrode connection portion 45*a*. Each second wiring 45*b* is bent in the middle in such a manner that the one end portion thereof connected to the second electrode connection portion 45*a* extends in the +Z direction along the corresponding one of the capacitor elements 43*b*, 43*d*, and 43*f* and the other end portion thereof extends in the −Y direction. In addition, each second wiring 45*b* has an L shape.

The second power supply terminal 45*f* has one end portion connected to the +X-side end portion of the second electrode connection portion 45*a*, and has the other end portion protruding outward (in the −Y direction) from the second electrode connection portion 45*a* in plan view, as in the first embodiment.

In the current detection system 1 including the capacitor device 3*e* and semiconductor device 2*e*, the first wirings 44*b* and second wirings 45*b* of the capacitor device 3*e* are connected to the first electrode terminals 14 and second electrode terminals 15 of the semiconductor device 2*e*. In addition, the first power supply wiring 4*a* and second power supply wiring 4*b* of the power supply device are connected to the first power supply terminal 44*f* and second power supply terminal 45*f* of the capacitor device 3*e*. Then, the current detection device 6 is able to detect a current with a first detection terminal 44*d* and a second detection terminal 44*e*, as in the first embodiment.

In the above capacitor device 3*e*, resistor parts are provided directly in first wirings 44*b*. Therefore, the first wirings 44*b* are connected directly to the first electrode terminals 14 of the semiconductor device 2*e* without anything interposed therebetween, which makes it possible to prevent an increase in stray inductance between the first wirings 44*b* and the first electrode terminals 14 of the semiconductor device 2*e*. In addition, since the resistor parts are shunt resistors, a reduction in the response speed due to the inherent limitations of Rogowski coils, which may occur in the case of using Rogowski coils, and an inability to track a rapidly changing signal are prevented.

Therefore, in the current detection system, the use of the capacitor device 3*e* improves the detection accuracy of a current flowing in the semiconductor device 2*e*. Then, the use of such detection results improves the accuracy of reliability evaluation of the semiconductor device 2*e*.

In addition, in the capacitor device 3*e*, the resistor parts included in the first wirings 44*b* are sealed with the sealing member 46 inside the case 40. That is, the resistor parts are fixed by the sealing member 46. Therefore, when and after the first wirings 44*b* of the capacitor device 3*e* are bonded respectively to the first electrode terminals 14 of the semiconductor device 2*e*, external stress exerted on the resistor parts through the first wirings 44*b* is alleviated. Consequently, it is possible to protect the resistor parts reliably, which in turns ensures the long-term durability of the resistor parts.

The disclosed techniques improve the detection accuracy of a current flowing in a semiconductor device and thus improve the accuracy of reliability evaluation of the semiconductor device.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A capacitor device connected to a semiconductor device, the capacitor device comprising:
- a capacitor element including a first electrode and a second electrode;
- a first wiring having a first one end portion connected to the first electrode and a first other end portion connected to a first electrode terminal of the semiconductor device; and
- a second wiring having a second one end portion connected to the second electrode and a second other end portion connected to a second electrode terminal of the semiconductor device, wherein
- a resistor is provided between the first one end portion and the first other end portion of the first wiring in an extending direction of the first other end portion in a plan view of the capacitor device, and is electrically connected directly to the first wiring.

2. The capacitor device according to claim 1, wherein the resistor is a shunt resistor.

3. The capacitor device according to claim 2, wherein the resistor has a resistance in a range from 0.01 mΩ to 1 mΩ.

4. The capacitor device according to claim 2, wherein the resistor is sandwiched by the first one end portion and the first other end portion of the first wiring and is included in the first wiring.

5. The capacitor device according to claim 1, wherein the first wiring further includes
- a first detection terminal provided adjacent to the resistor on the first one end portion, and
- a second detection terminal provided adjacent to the resistor on the first other end portion.

6. The capacitor device according to claim 1, further comprising a sealing member sealing the capacitor element, the first wiring including the resistor and the second wiring, with the first other end portion of the first wiring and the second other end portion of the second wiring being exposed.

7. The capacitor device according to claim 6, wherein:
- the first wiring includes
  - a first detection terminal provided adjacent to the resistor on the first one end portion, and
  - a second detection terminal provided adjacent to the resistor on the first other end portion; and
- one end of the first detection terminal opposite to an other end of the first detection terminal that is connected to the first one end portion and one end of the second detection terminal opposite to an other end of the second detection terminal that is connected to the first other end portion are each exposed from the sealing member.

8. The capacitor device according to claim 1, further comprising:
- a first power supply terminal connected to the first one end portion of the first wiring; and
- a second power supply terminal connected to the second one end portion of the second wiring, the first and second power supply terminals being connected to a power supply of the capacitor device.

9. The capacitor device according to claim 1, wherein the resistor has a substantially equal thickness to that of the first wiring, and a substantially equal width to that of the first wiring.

10. The capacitor device according to claim 1, wherein the first wiring is an L-shaped plate with the first one end portion and the first other end portion thereof extending in two directions perpendicular to each other.

11. The capacitor device according to claim 1, wherein the second wiring is an L-shaped plate with the second one end portion and the second other end portion thereof extending in two directions perpendicular to each other.

* * * * *